US012765049B2

(12) United States Patent
Chang et al.

(10) Patent No.: US 12,765,049 B2
(45) Date of Patent: Oct. 13, 2026

(54) SEMICONDUCTOR STRUCTURE AND METHOD FOR FORMING THE SAME

(71) Applicant: TAIWAN SEMICONDUCTOR MANUFACTURING COMPANY LTD., Hsinchu (TW)

(72) Inventors: Po-Ying Chang, Yunlin County (TW); Wen-Lang Wu, Taichung City (TW); Chang-Tai Lee, Nantou County (TW); Li-Chung Kuo, Taichung City (TW); Yun-Han Lin, Taichung City (TW); Chen-Chuan Yang, Taichung City (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 595 days.

(21) Appl. No.: 18/319,673

(22) Filed: May 18, 2023

(65) Prior Publication Data

US 2024/0387546 A1 Nov. 21, 2024

(51) Int. Cl.

| | |
|---|---|
| ***H10D 84/85*** | (2025.01) |
| ***H10D 30/01*** | (2025.01) |
| ***H10D 30/62*** | (2025.01) |
| ***H10D 64/66*** | (2025.01) |
| ***H10D 84/01*** | (2026.01) |
| ***H10D 84/03*** | (2025.01) |

(52) U.S. Cl.
CPC ......... *H10D 84/853* (2025.01); *H10D 30/024* (2025.01); *H10D 30/6211* (2025.01); *H10D 64/666* (2025.01); *H10D 84/0193* (2025.01); *H10D 84/038* (2025.01)

(58) Field of Classification Search
CPC ............. H10D 84/853; H10D 30/6211; H10D 64/666; H10D 30/024; H10D 84/038; H10D 84/0193
See application file for complete search history.

(56) References Cited

U.S. PATENT DOCUMENTS

2018/0226300 A1* 8/2018 Song .................... H10D 84/853

FOREIGN PATENT DOCUMENTS

CN 103915387 B * 6/2016 ........... H10D 64/017
CN 103915386 B * 5/2017 ......... H10D 84/0181

* cited by examiner

*Primary Examiner* — Christine A Enad
(74) *Attorney, Agent, or Firm* — WPAT LAW; Anthony King

(57) ABSTRACT

A semiconductor structure includes a first transistor and a second transistor. The first transistor includes a first fin structure and a first metal gate over the first fin structure. The first metal gate includes a first work function metal layer and a first gap-filling metal layer. The second transistor includes a second fin structure and a second metal gate over the second fin structure. The second metal gate includes a second work function metal layer and a second gap-filling metal layer. The first metal gate and the second metal gate provide a same work function. A width of the first metal gate is equal to a width of the second metal gate. A width of a top surface of the first gap-filling metal layer is greater than a width of a top surface of the second gap-filling metal layer.

20 Claims, 20 Drawing Sheets

SEMICONDUCTOR STRUCTURE AND METHOD FOR FORMING THE SAME

BACKGROUND

The semiconductor integrated circuit (IC) industry has experienced rapid growth. In the course of IC evolution, functional density (i.e., the number of interconnected devices per chip area) has generally increased while geometry size (i.e., the size of the smallest component (or line) that can be created using a fabrication process) has decreased. This scaling down process generally provides benefits by increasing production efficiency and lowering associated costs. Such scaling down has also increased the complexity of processing and manufacturing ICs, and for these advances to be realized, similar developments in IC manufacturing are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
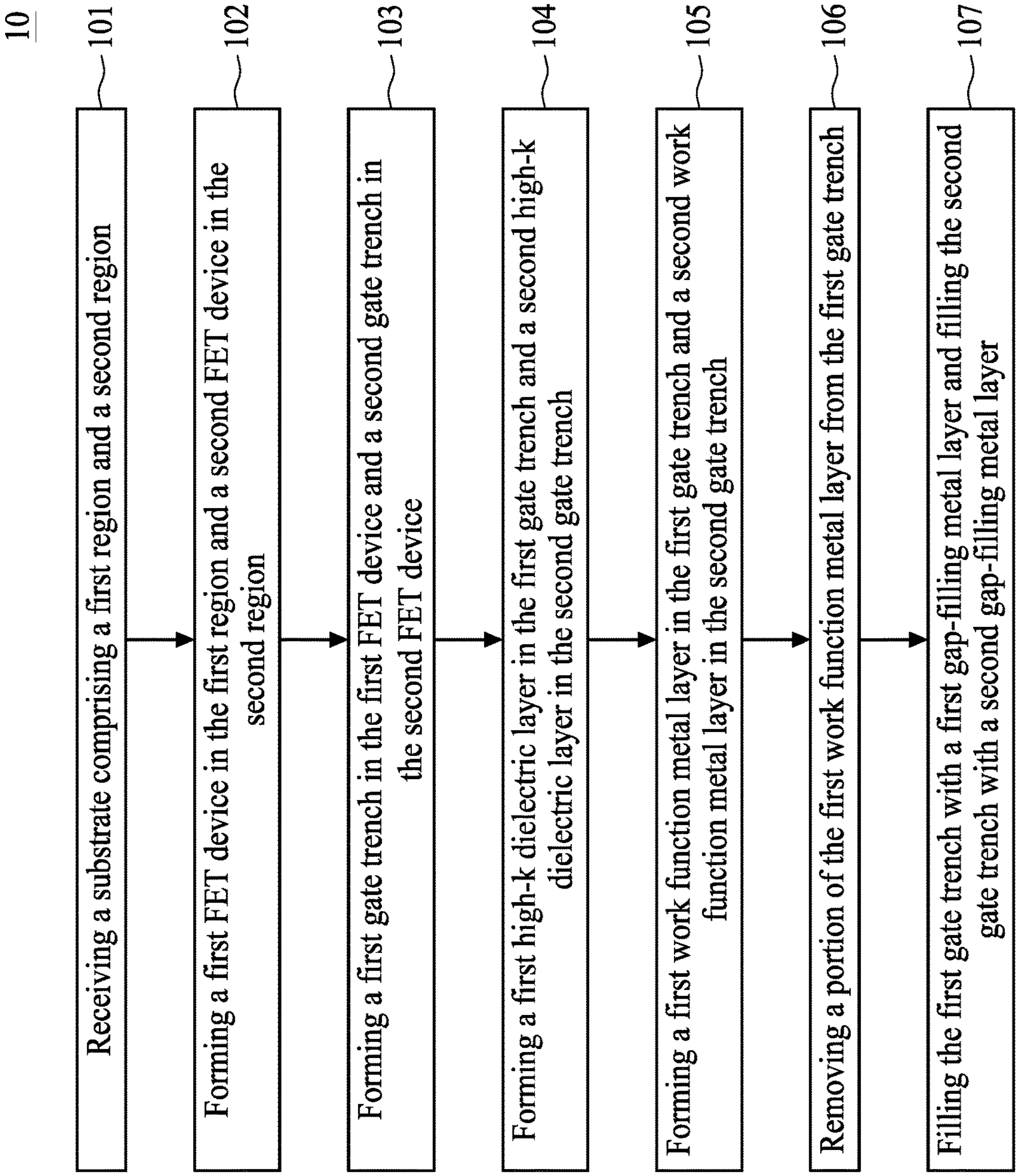
FIG. 1 is a flowchart representing a method for forming a semiconductor structure according to aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

As device geometry is reduced, parasitic resistance has increased. The parasitic resistance may degrade device performance by lowering an operation frequency of transistors. Such effect has become more evident in fin field-effect transistor (FinFET) devices than in planar devices and has affected transistors for radio frequency (RF) devices more adversely than transistors for logic devices. Therefore, how to reduce resistance of RF devices (i.e., RF FinFET devices) while maintaining high overall device density in an integrated circuit is an object of the present disclosure.

According to one embodiment of the present disclosure, a semiconductor structure including an RF device and a logic device is provided. In some embodiments, both the RF device and the logic device can be planar devices or non-planar devices. In some embodiments, the non-planar RF device and the non-planar logic device are FinFET devices. In some embodiments, the FinFET devices may be GAA devices, nanosheet devices, Omega-gate (a-gate) devices, Pi-gate (H-gate) devices, dual-gate devices, or tri-gate devices. The RF device and the logic device respectively include a metal gate. In some embodiments, a width of the metal gate of the RF device is equal to a width of the metal gate of the logic device. However, a width of a gap-filling metal in the metal gate of the RF device is greater than a width of a gap-filling metal in the metal gate of the logic device. In such embodiments, a volume of the gap-filling metal of the RF device is increased, and thus parasitic resistance of the RF device is reduced.

FIG. 1 is a flowchart representing a method 10 for forming a semiconductor structure according to aspects of the present disclosure. The semiconductor structure includes at least an RF device and a logic device. The RF device may perform power amplification, splitting, and/or combining; the logic device may perform input/output (I/O) functions and logic functions including AND, OR, NOR, and inverters, as well as other functions. In some embodiments, the RF device operates at a frequency about many times higher than a frequency of the logic device. For example, the RF device may operate at a frequency in a range from 3 GHz to 300 GHz, such as from 20 GHz to 300 GHz, while the logic device may operate at a frequency below 10 GHz. Further, the RF device and the logic device may be in separate regions of an IC or may be disposed in a common region of an IC.

In some embodiments, the method for forming the semiconductor structure 10 includes a number of operations (101, 102, 103, 104, 105, 106 and 107). The method 10 will be further described according to one or more embodiments. It should be noted that the operations of the method 10 may be rearranged or otherwise modified within the scope of the various aspects. It should further be noted that additional processes may be provided before, during, and after the method 10, and that some other processes may be only briefly described herein.

Figure 2:
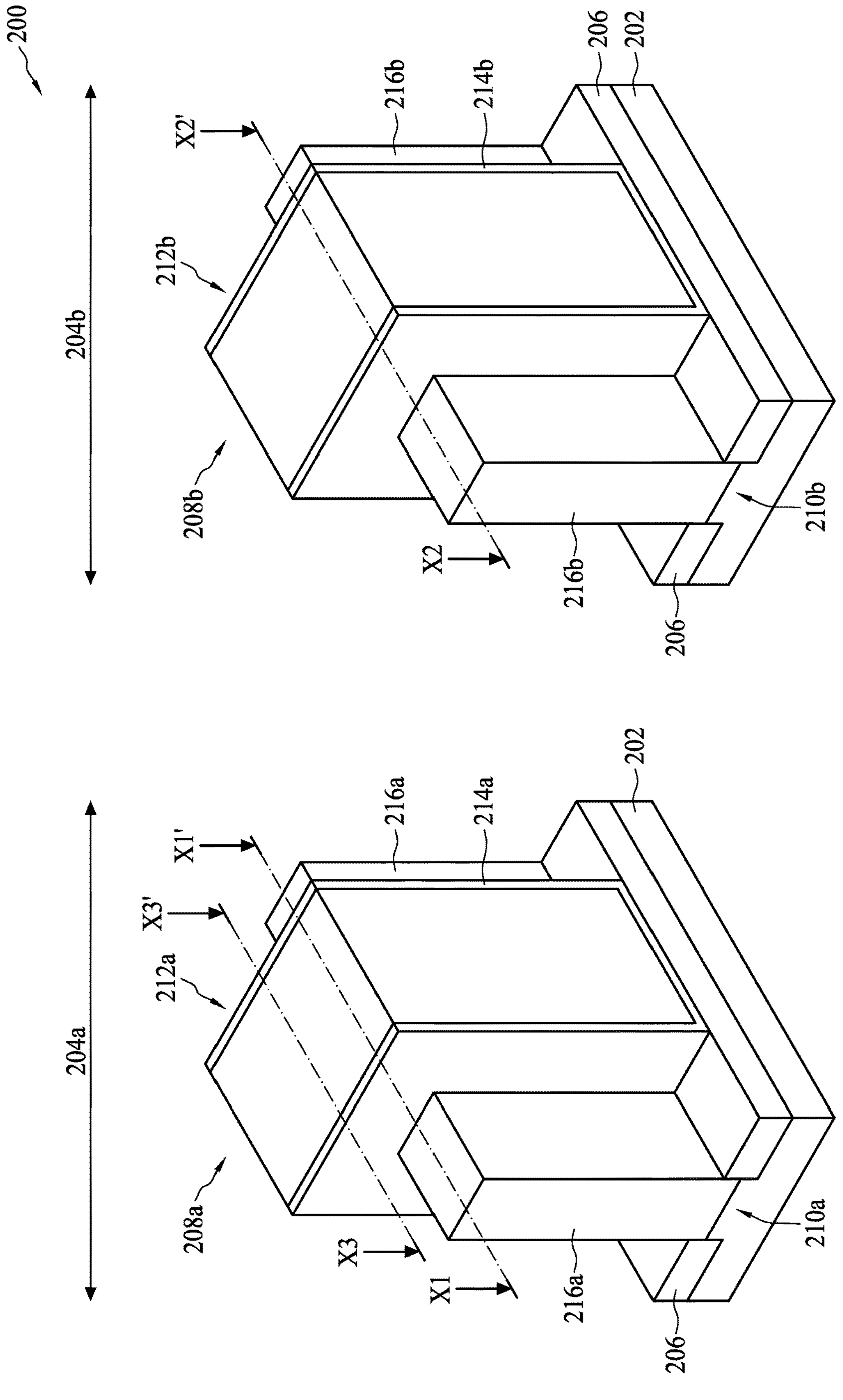
FIG. 2 shows perspective views illustrating portions of a semiconductor structure according to aspects of the present disclosure in one or more embodiments.

FIG. 2 shows perspective views illustrating portions of a semiconductor structure according to aspects of the present disclosure. In operation 101, a substrate 202 is received. In some embodiments, the substrate 202 may be a semiconductor substrate such as a silicon substrate. The substrate 202 may also include other semiconductors such as germanium (Ge), silicon carbide (SiC), silicon germanium (SiGe), or diamond. Alternatively, the substrate 202 may include a compound semiconductor and/or an alloy semiconductor. The substrate 202 may include various layers, including conductive or insulating layers formed on a semiconductor substrate. The substrate 202 may include various doping configurations depending on design requirements, as is known in the art. For example, different doping profiles (e.g., n wells or p wells) may be formed on the substrate 202 in regions designed for different device types (e.g., n-type field-effect transistors (NFET), or p-type field-effect transistors (PFET)). The suitable doping may include ion implantation of dopants and/or diffusion processes.

As shown in FIG. 2, the substrate 202 may have a first region 204*a* and a second region 204*b* defined thereon. Further, the substrate 202 may include isolation structures, e.g., shallow trench isolation (STI) structures 206 interposing the first and second regions 204*a* and 204*b*. The first and second regions 204*a* and 204*b* are defined for accommodating different devices.

In operation 102, a first FET device 208*a* is formed in the first region 204*a*, and a second FET device 208*b* is formed in the second region 204*b*. In some embodiments, the first FET device 208*a* is an RF transistor while the second FET device 208*b* is a logic transistor, but the disclosure is not limited thereto. Further, the first FET device 208*a* is an n-type RF transistor, and the second FET device 208*b* is an n-type logic transistor. In other embodiments, the first FET device 208*a* may be a memory device while the second FET device 208*b* may be another type of device.

In some embodiments, the first FET device 208*a* includes a fin structure 210*a*, a sacrificial gate 212*a*, a spacer 214*a* and a source/drain 216*a*. The second FET device 208*b* includes a fin structure 210*b*, a sacrificial gate 212*b*, a spacer 214*b* and a source/drain 216*b*. A portion of the fin structure 210*a* covered by the sacrificial gate 212*a* serves as a channel region, and a portion of the fin structure 210*b* covered by the sacrificial gate 212*b* serves as a channel region. "Source/drain" may refer to a source or a drain, individually or collectively depending upon the context. In some embodiments, a width of the fin structure 210*a* and a width of the fin structure 210*b* are equal, but the disclosure is not limited thereto.

In some embodiments, the sacrificial gates 212*a* and 212*b* may respectively include a dielectric layer and a sacrificial semiconductor layer. In some embodiments, the sacrificial semiconductor layers are made of polysilicon, but the disclosure is not limited thereto. In some embodiments, the spacers 214*a* and 214*b* can be formed over sidewalls of the sacrificial gates 212*a* and 212*b*. In some embodiments, the spacers 214*a* and 214*b* are made of silicon nitride (SiN), silicon carbide (SiC), silicon oxide (SiO), silicon oxynitride (SiON), silicon carbide or any other suitable material, but the disclosure is not limited thereto. In some embodiments, the spacers 214*a* and 214*b* are formed by deposition and etch-back operations.

As shown in FIG. 2, in some embodiments, the source/drain 216*a* is formed over the fin structure 210*a* at two opposite sides of the sacrificial gate 212*a*. Similarly, the source/drain 216*b* is formed over the fin structure 210*b* at two opposite sides of the sacrificial gate 212*b*. In some embodiments, heights of the source/drain 216*a* and the source/drain 216*b* may be greater than heights of the fin structures 210*a* and 210*b*. In some embodiments, the source/drain 216*a* and the source/drain 216*b* may be formed by forming recesses in the fin structures 210*a* and 210*b* and growing a strained material in the recesses by an epitaxial (epi) process. In addition, a lattice constant of the strained material may be different from a lattice constant of the fin structures 210*a* and 210*b*. Accordingly, the source/drain 216*a* and the source/drain 216*b* may serve as stressors that improve carrier mobility. In some embodiments, the source/drain 216*a* and the source/drain 216*b* may both include n-type dopants, but the disclosure is not limited thereto.

Figure 3:
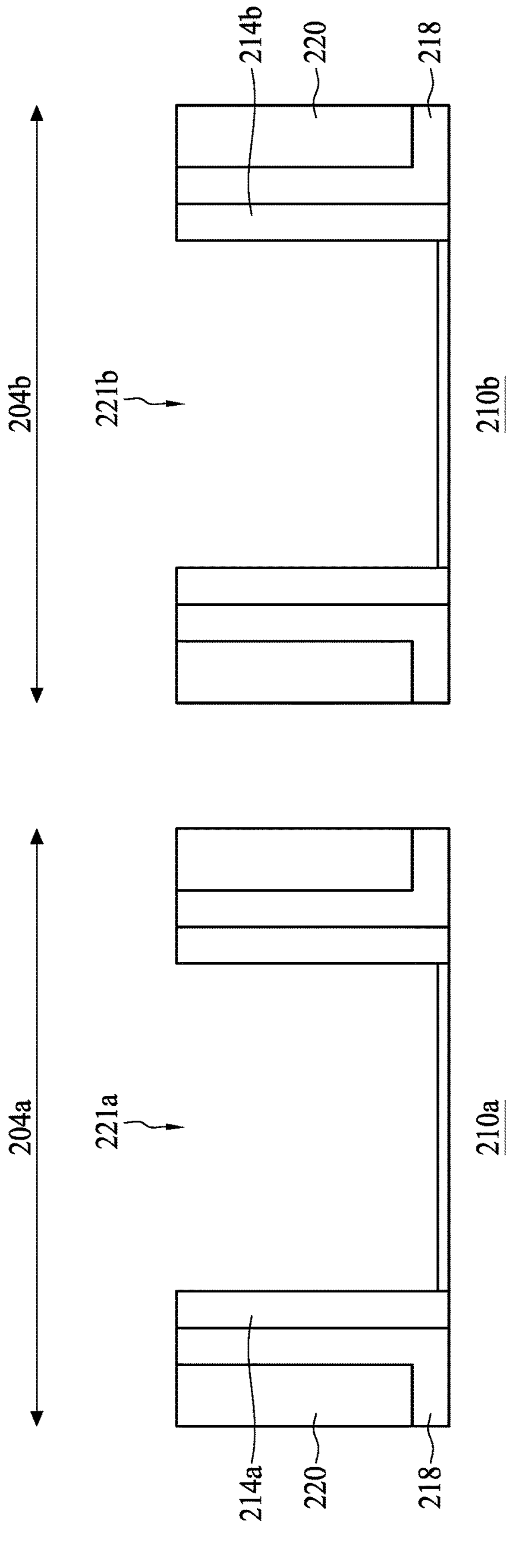
FIGS. 3 to 12 show cross-sectional views taken along lines X1-X1' and X2-X2' of FIG. 2, respectively at various stages in the method for forming the semiconductor structure according to aspects of the present disclosure.

Please refer to FIG. 3, which shows cross-sectional views taken along lines X1-X1' and X2-X2' of FIG. 2, respectively. In some embodiments, after the forming of the source/drain 216*a* and the source/drain 216*b*, a contact etch stop layer (CESL) 218 may be formed to cover the sacrificial gates 212*a* and 212*b* over the substrate 202. In some embodiments, the CESL 218 can include silicon nitride, silicon oxynitride, and/or other applicable materials. Subsequently, an inter-layer dielectric (ILD) structure 220 may be formed on the CESL 218 in accordance with some embodiments. The ILD structure 220 may include multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon-doped silicon oxide, amorphous fluorinated carbon, parylene, bis-benzocyclobutenes (BCB), or polyimide. Next, a polishing process is performed on the ILD structure 220 and the CESL 218 to expose top surfaces of the sacrificial gates 212*a* and 212*b*. In some embodiments, the ILD structure 220 and the CESL 218 are planarized by a chemical mechanical polishing (CMP) process until the top surfaces of the sacrificial gates 212*a* and 212*b* are exposed.

In operation 103, a gate trench 221*a* is formed in the first FET device 208*a*, and a gate trench 221*b* is formed in the second FET device 208*b*. In some embodiments, a width of the gate trench 221*a* is equal to a width of the gate trench 221*b*, but the disclosure is not limited thereto. In some embodiments, the sacrificial semiconductor layer is removed. In some embodiments, the dielectric layer may be removed for forming an interfacial layer (IL). In some embodiments, the dielectric layer may be left in the gate trench, though not shown. It should be noted that the removal of the dielectric layer may be performed depending on different process or product requirements. Accordingly, the fin structure 210*a* is exposed through the gate trench 221*a*, and the fin structure 210*b* is exposed through the gate trench 221*b*, as shown in FIG. 3.

Figure 4:
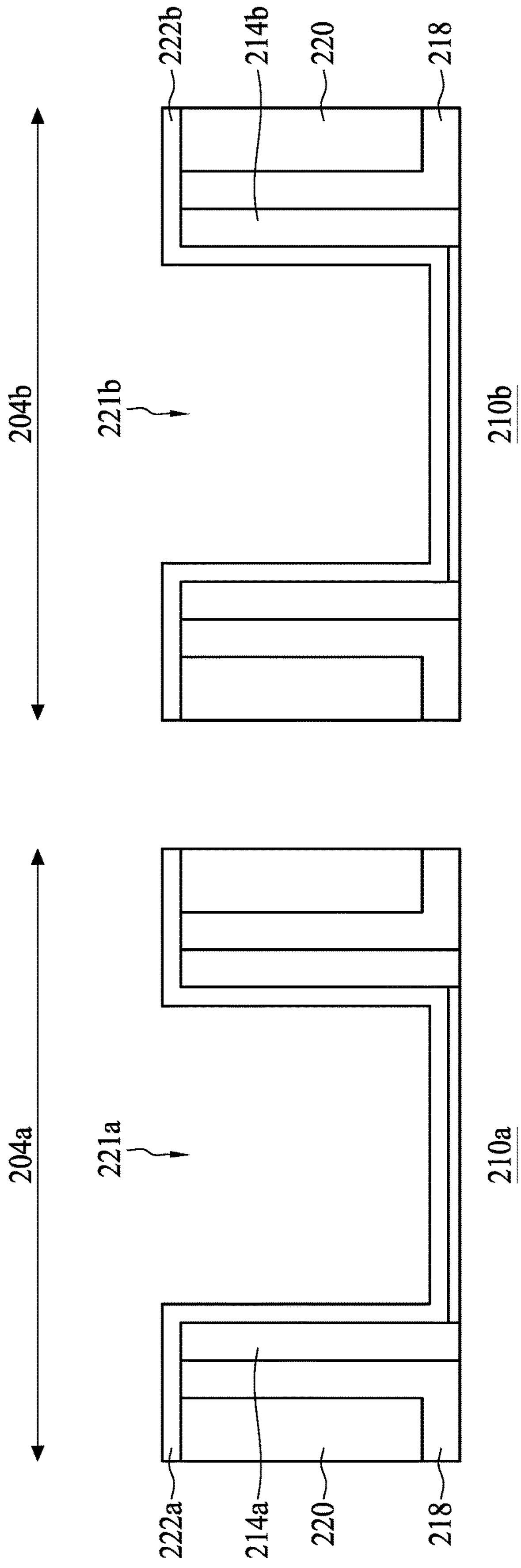

Referring to FIG. 4, in some embodiments, in operation 104, a high-k dielectric layer 222*a* is formed in the gate trench 221*a*, and a high-k dielectric layer 222*b* is formed in the gate trench 221*b*. A thickness of the high-k dielectric layer 222*a* and a thickness of the high-k dielectric layer 222*b* are similar. In some embodiments, an IL layer may be formed prior to the forming of the high-k dielectric layers 222*a* and 222*b*, though not shown. The IL layer may include an oxide-containing material such as SiO or SiON. In some embodiments, the IL layer covers portions of the fin structures 210*a* and 210*b* exposed in the gate trenches 221*a* and 221*b*. The high-k dielectric layers 222*a* and 222*b* may be simultaneously formed on the IL layer and conformally formed in the gate trenches 221*a* and 221*b*. Accordingly, the high-k dielectric layer 222*a* covers at least sidewalls of the gate trench 221*a*, and the high-k dielectric layer 222*b* covers at least sidewalls of the gate trench 221*b*. In some embodiments, the high-k dielectric layers 222*a* and 222*b* include a high-k dielectric material having a high dielectric constant, for example, a dielectric constant greater than that of thermal silicon oxide (~3.9). The high-k dielectric material may include hafnium oxide ($HfO_2$), zirconium oxide ($ZrO_2$), lanthanum oxide ($La_2O_3$), aluminum oxide ($Al_2O_3$), titanium oxide ($TiO_2$), yttrium oxide ($Y_2O_3$), strontium titanate ($SrTiO_3$), hafnium oxynitride ($HfO_xN_y$), other suitable metal-oxides, or combinations thereof.

Figure 5:
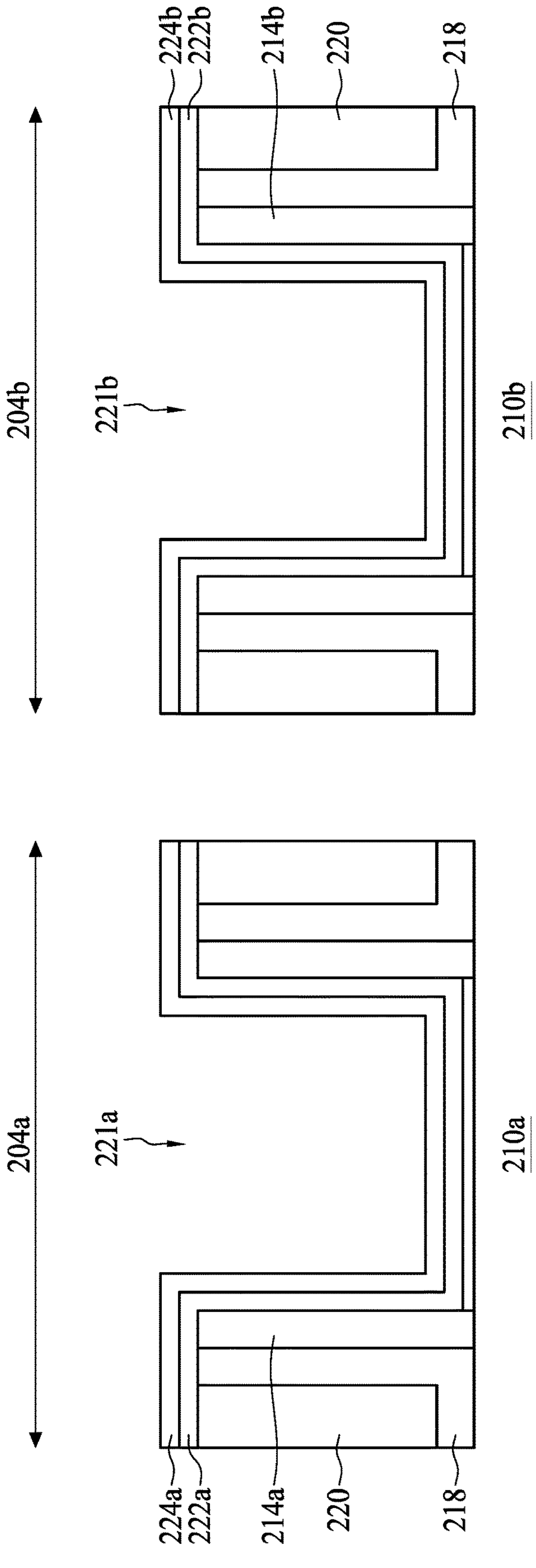

Referring to FIG. 5, in some embodiments, in operation 105, the method 10 includes forming a work function metal layer in the gate trench 221*a* and a work function metal layer in the gate trench 221*b*. In some embodiments, the operation 105 further includes forming other layers prior to and after the forming of the work function metal layers. For example, a metal layer 224*a* may be formed in the gate trench 221*a* and a metal layer 224*b* may be formed in the gate trench 221*b*. Additionally, the metal layer 224*a* is in contact with the high-k dielectric layer 222*a*, and the metal layer 224*b* is in contact with the high-k dielectric layer 222*b*. In some embodiments, the metal layers 224*a* and 224*b* include a same material such as, for example but not limited thereto, titanium nitride (TiN). A thickness of the metal layer 224*a* may be equal to a thickness of the metal layer 224*b*, but the disclosure is not limited thereto. In some embodiments, the metal layers 224*a* and 224*b* serve as a buffer layer. In other embodiments, the metal layers 224*a* and 224*b* serve as a barrier layer. Materials and thicknesses of the metal layers 224*a* and 224*b* may be selected depending functions that the metal layers 224*a* and 224*b* provide, and therefore such details are omitted for brevity.

Figure 6:
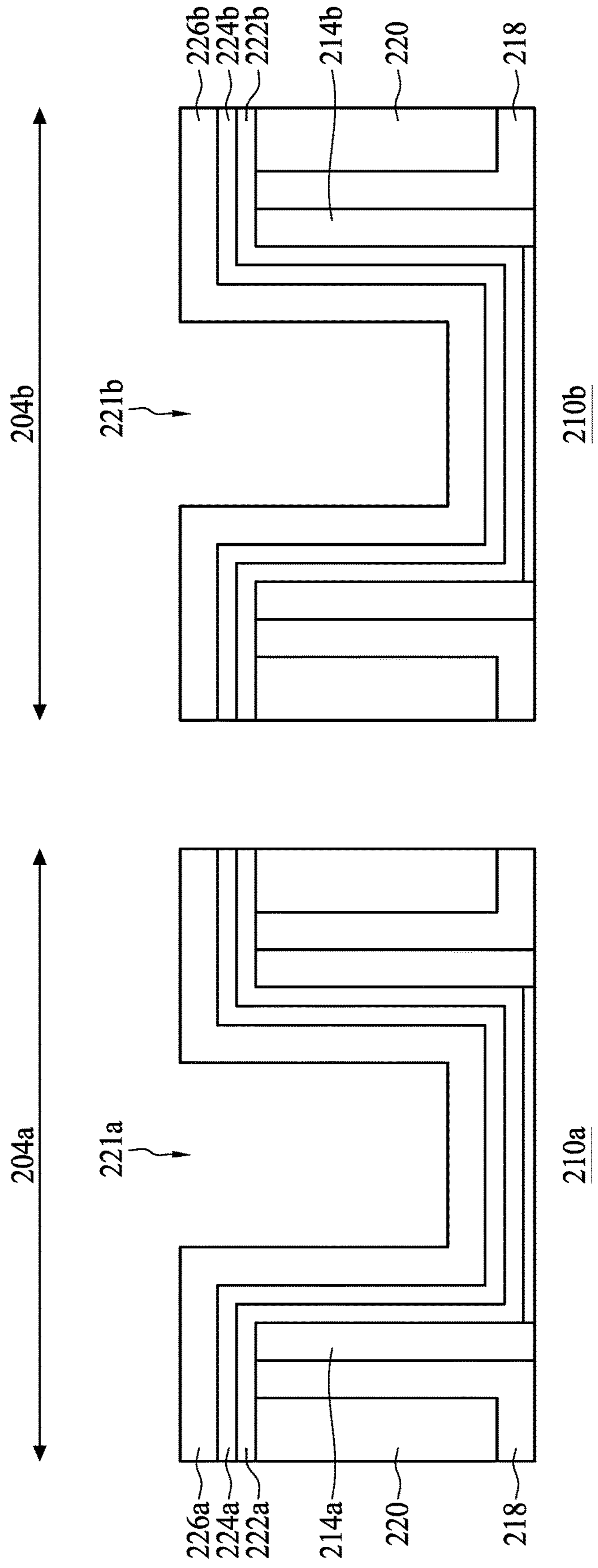

Referring to FIG. 6, in some embodiments, a work function metal layer 226*a* is formed over the metal layer 224*a*, and a work function metal layer 226*b* is formed over the metal layer 224*b*. In some embodiments, the work function metal layer 226*a* and the work function metal layer 226*b* may include a same material. For example, when both the first and second FET devices 208*a* and 208*b* are n-type devices, the work function metal layers 226*a* and 226*b* may include titanium (Ti), aluminum (Al), titanium aluminum (TiAl), tantalum carbide (TiC), tantalum carbide nitride (TiCN), tantalum silicon nitride (TaSiN), or combinations thereof. In some alternative embodiments, when both the first and second FET devices 208*a* and 208*b* are p-type devices, the work function metal layers 226*a* and 226*b* may include TiN, TaN, ruthenium (Ru), molybdenum (Mo), tungsten (W), platinum (Pt), TiAl, or a combination thereof. The work function metal layers 226*a* and 226*b* may be formed by CVD, PVD and/or other suitable process. In some embodiments, thicknesses of the work function metal layers 226*a* and 226*b* are greater than thicknesses of the buffer layers 224*a* and 224*b*.

In some embodiments, an intervening metal layer (not shown) can be formed prior to the forming of the work function metal layers 226*a* and 226*b*, though not shown. In such embodiments, the intervening metal layer is disposed between the metal layer 224*a* and the work function metal layer 226*a*, and between the metal layer 224*b* and the work function metal layer 226*b*. In some embodiments, the intervening metal layer may include materials different from those of the work function metal layers 226*a* and 226*b*. For example, when the work function metal layers 226*a* and 226*b* include TiAl, the intervening metal layer may include TiN, but the disclosure is not limited thereto. In some embodiments, the intervening metal layer and the metal layers 224*a* and 224*b* may include a same material. In some alternative embodiments, the intervening metal layer and the metal layers 224*a* and 224*b* may include different materials. In some embodiments, a thickness of the intervening metal layer may be equal to a thickness of the metal layers 224*a* and 224*b*. In other embodiments, the thickness of the intervening metal layer may be two to five times the thickness of the metal layers 224*a* and 224*b*. In some embodiments, the intervening metal layer may be a single-layered structure. In other embodiments, the intervening metal layer may be a multilayered structure. In such embodiments, the intervening metal layer may include TiN and TaN, but the disclosure is not limited thereto.

Figure 7:
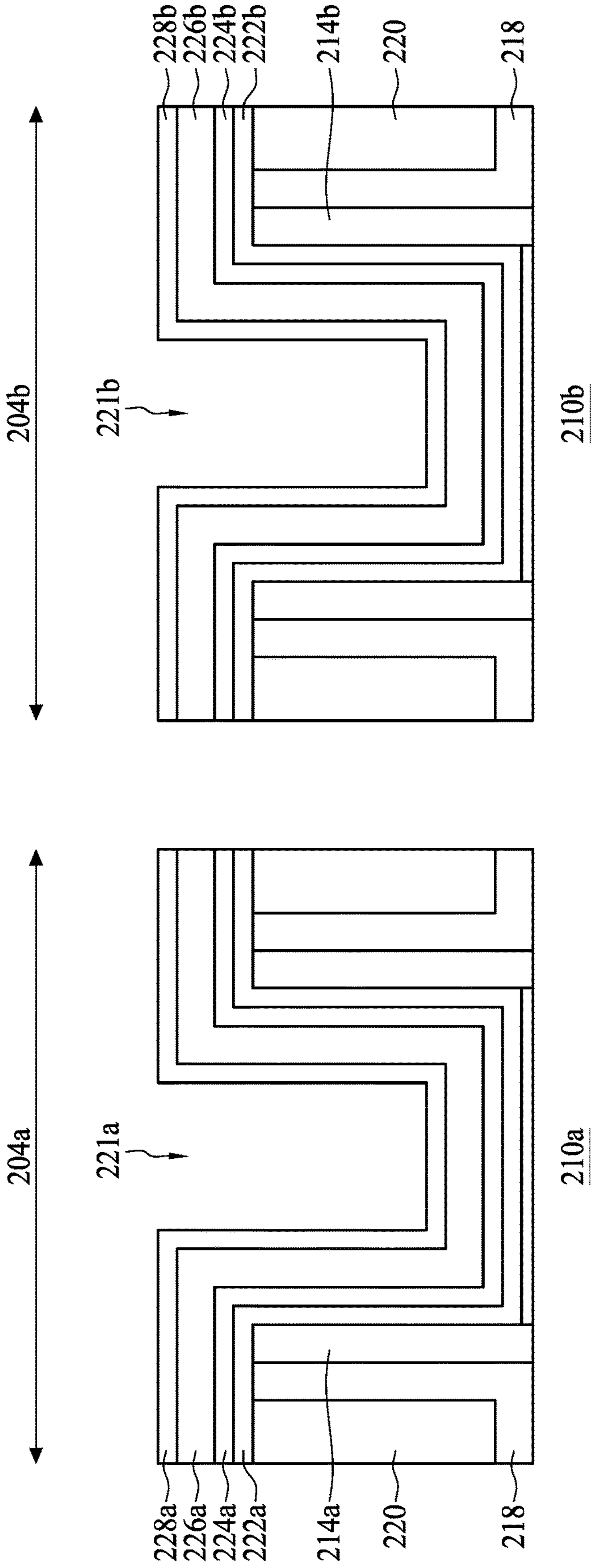

Referring to FIG. 7, in some embodiments, another metal layer 228*a* is formed over the work function metal layer 226*a*, and another metal layer 228*b* is formed over the work function metal layer 226*b*. In some embodiments, the metal layers 228*a* and 228*b* include TiN, but the disclosure is not limited thereto. Thicknesses of the metal layers 228a and 228b are less than thicknesses of the work function metal layers 226a and 226b.

Figure 8:
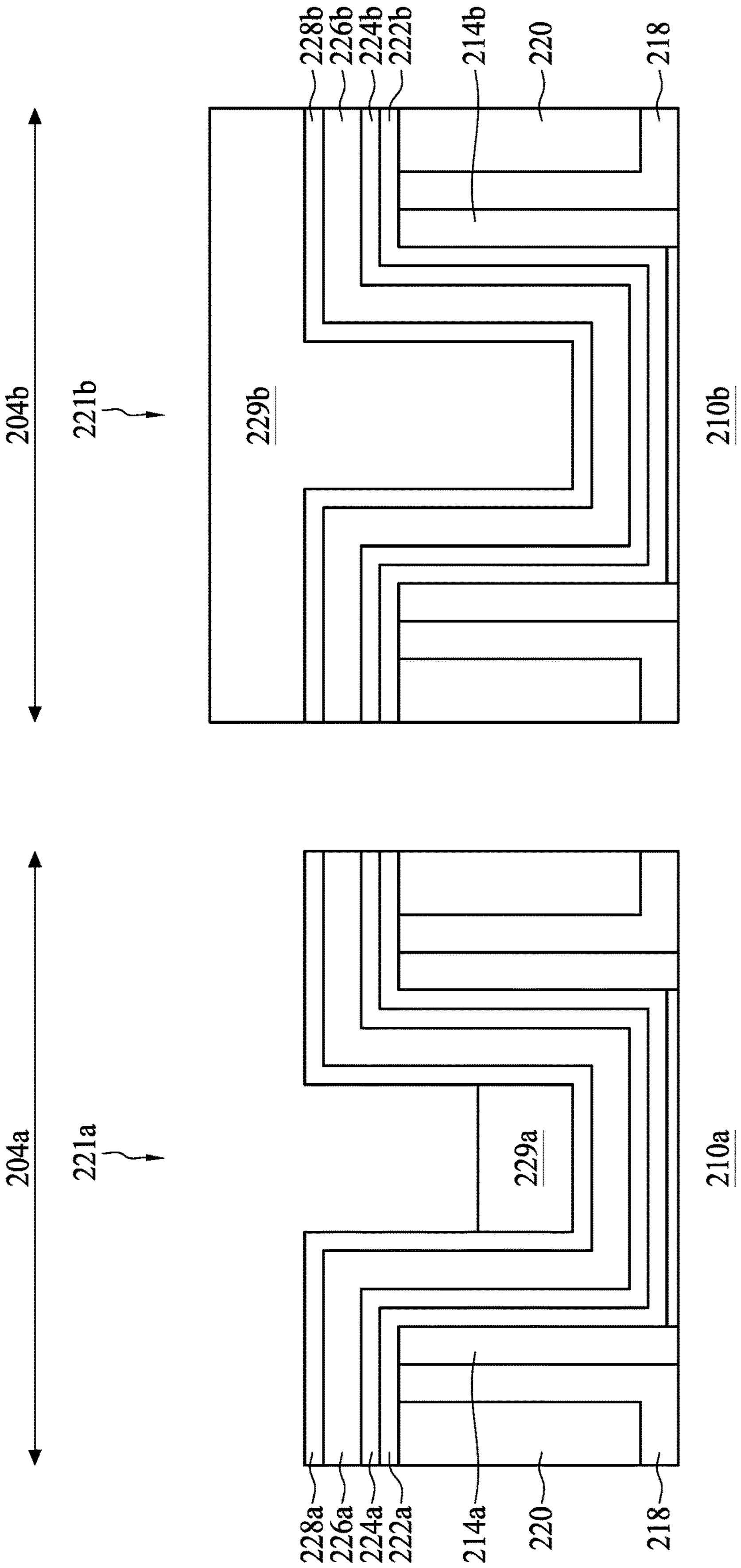

In operation 106, a portion of the work function metal layer 226a is removed from the gate trench 221a. In some embodiments, operation 106 may include further processes. For example, a sacrificial layer 229a may be formed in the gate trench 221a and a sacrificial layer 229b may be formed in the gate trench 221b. In some embodiments, the sacrificial layers 229a and 229b include a same material, such as a photoresist, but the disclosure is not limited thereto. In some embodiments, a sacrificial material is formed over the substrate 202 and fills the gate trenches 221a and 221b. Subsequently, portions of the sacrificial material are removed from the first region 204a to form the sacrificial layer 229a in the first region and the sacrificial layer 229b in the second region 204b. As shown in FIG. 8, a top surface of the sacrificial layer 229a is lower than an opening of the gate trench 221a. That is, portions of the metal layer 228a are exposed through the gate trench 221a while other portions of the metal layer 228a are covered by the sacrificial layer 229a. In contrast, the sacrificial layer 229b in the second region 204b covers the metal layer 228b entirely.

Figure 9:
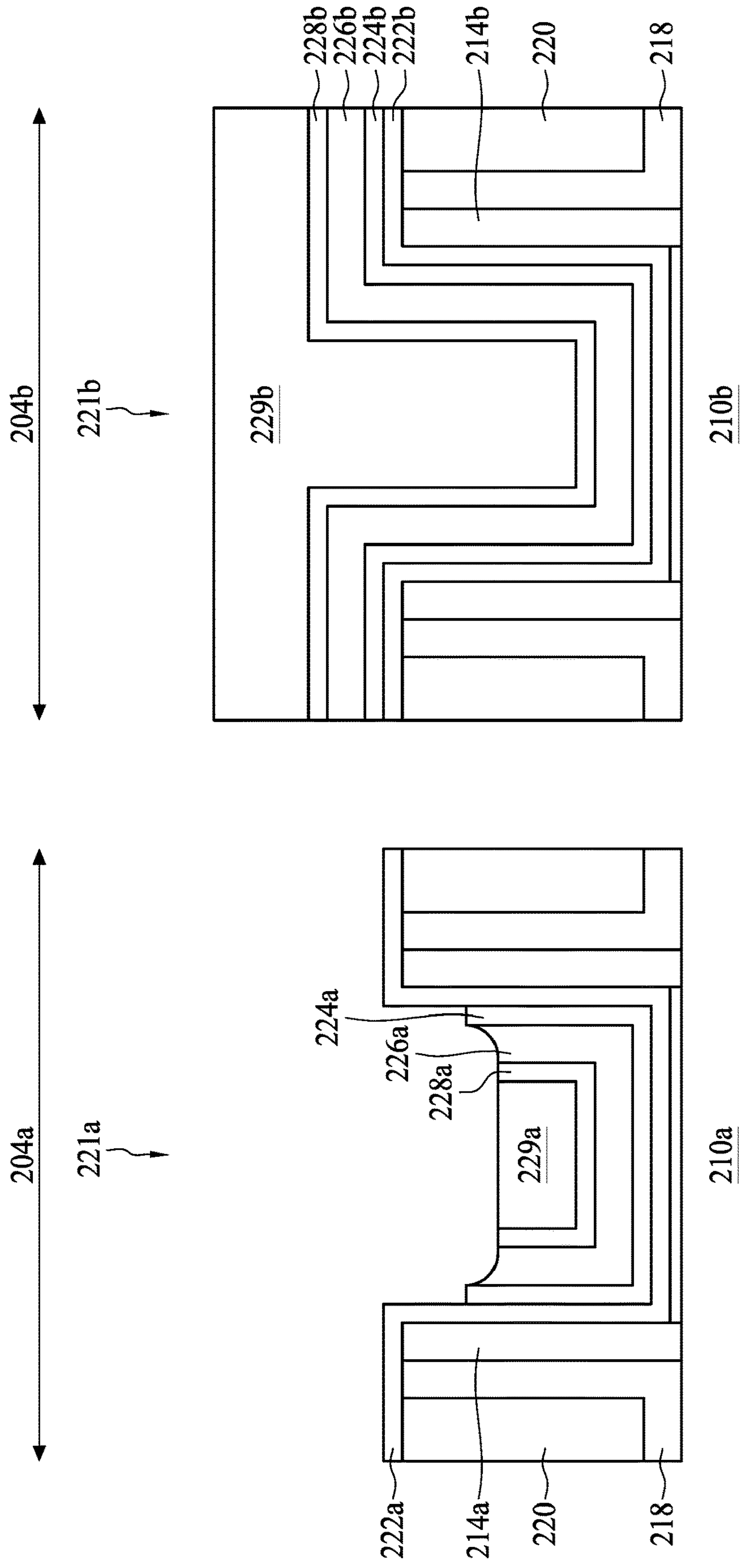
Figure 10:
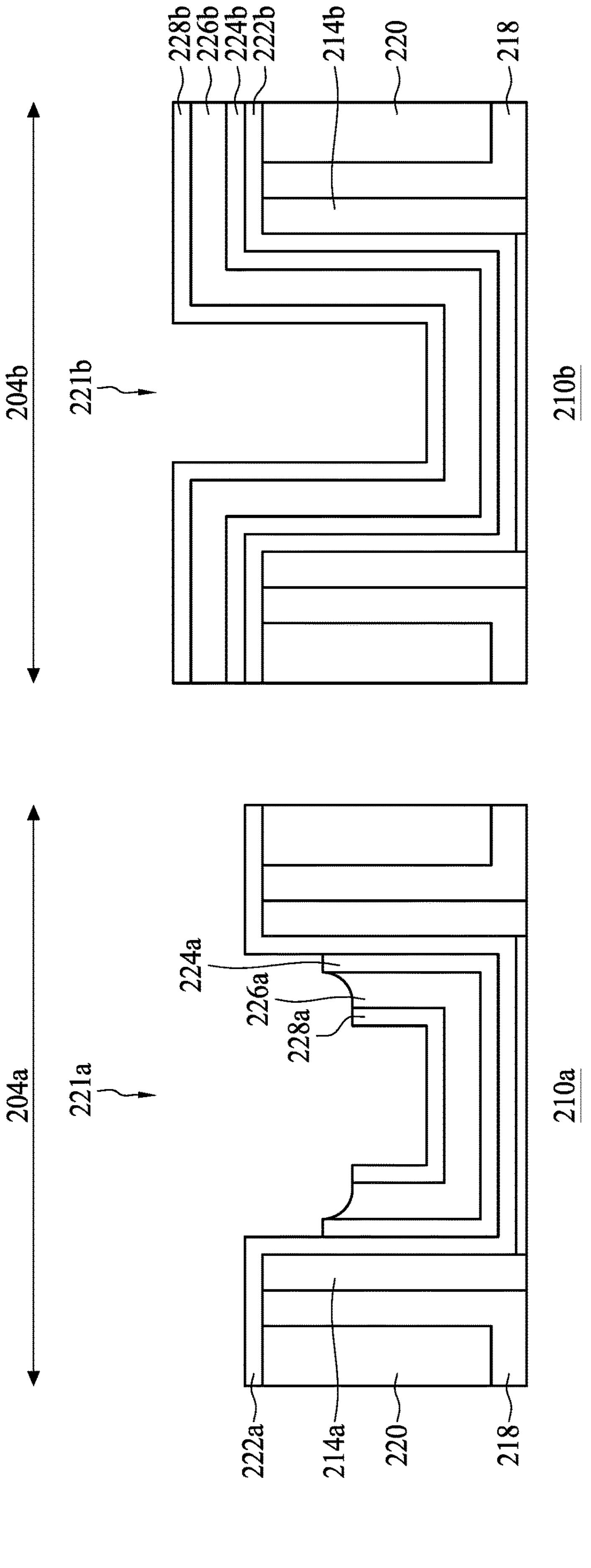

Referring to FIG. 9, in operation 106, portions of the metal layer 228a, portions of the work function metal layer 226a and portions of the metal layer 224a are removed from the gate trench 221a and from the first region 204a. Subsequently, in some embodiments, topmost portions of the metal layer 228a, topmost portions of the work function metal layer 226a and topmost portions of the metal layer 224a are lower than the opening of the gate trench 221a. In some embodiments, the high-k dielectric layer 222a serves as an etch stop layer, and thus the ILD structure 220 and the CESL 218 may be protected by the high-k dielectric layer 222a during the removing of the portions of the metal layer 228a, the work function metal layer 226a and the metal layer 224a. In contrast to such removal, in the second regions 204b, the metal layer 228b, the work function metal layer 226b and the metal layer 224b are protected by the sacrificial layer 229b and thus remain intact. Subsequently, the sacrificial layers 229a and 229b are removed, as shown in FIG. 10.

Figure 11:
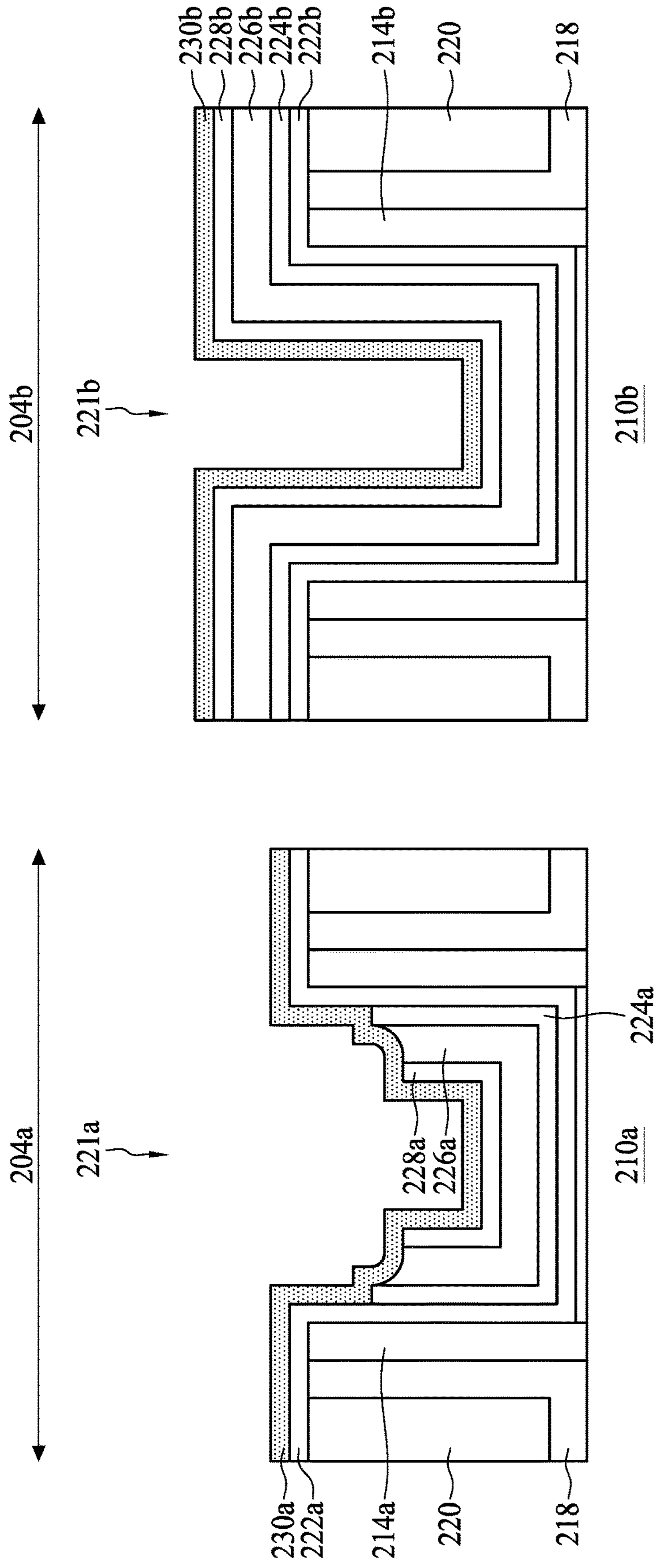

In operation 107, the gate trenches 221a and 221b are filled with a gap-filling metal layer. In some embodiments, the operation 107 includes additional processes. For example, an intervening metal layer 230a is formed in the gate trench 221a, and an intervening metal layer 230b is formed in the gate trench 221b, as shown in FIG. 11. In some embodiments, the intervening metal layers 230a and 230b include a same material, such as TiN, but the disclosure is not limited thereto. In some embodiments, the intervening metal layers 230a and 230b include a same thickness, but the disclosure is not limited thereto. The intervening metal layers 230a and 230b may serve as a glue layer for improving attachment between the metal layers 228a and 228b and a to-be-formed layer.

Figure 12:
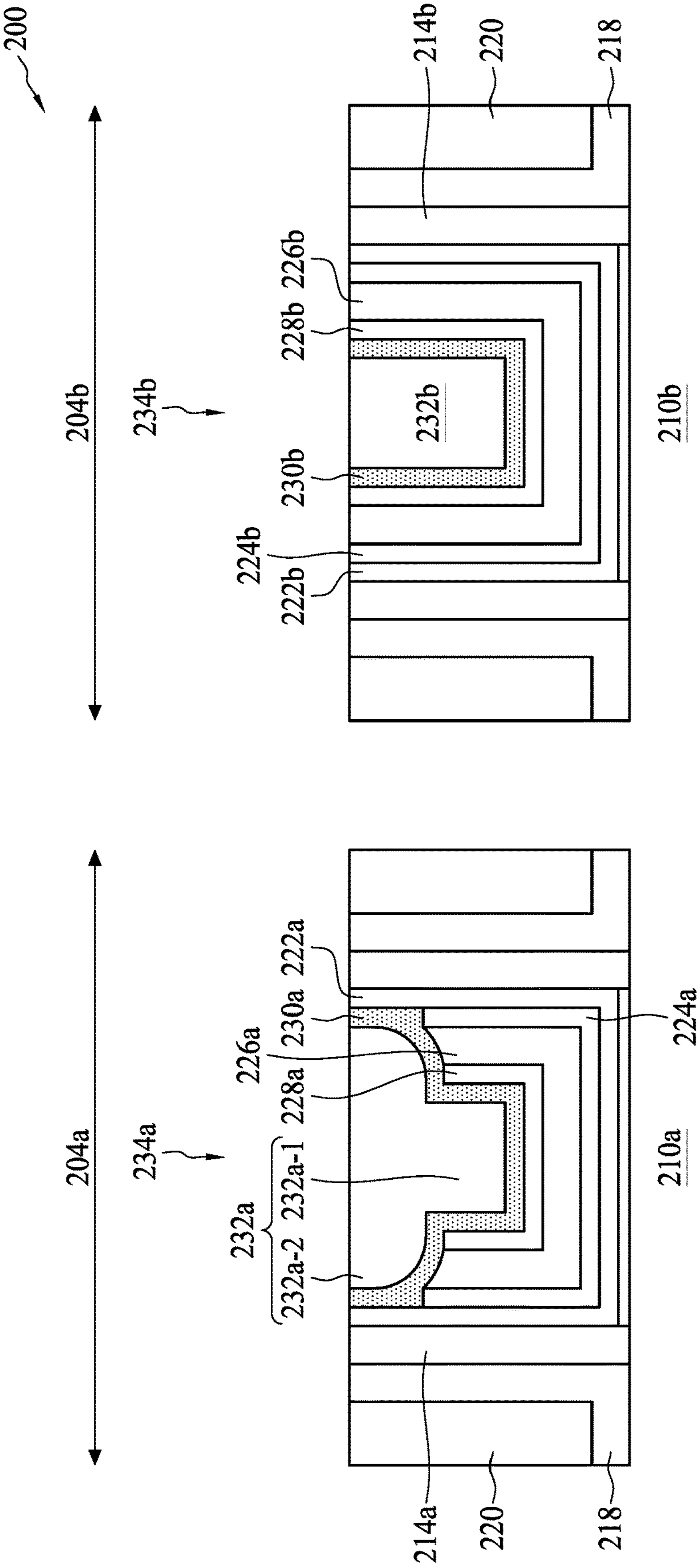

Referring to FIG. 12, a gap-filling metal layer 232a is formed to fill the gate trench 221a, and a gap-filling metal layer 232b is formed to fill the gate trench 221b. The gap-filling metal layers 232a and 232b may include metal materials having low resistance, such as aluminum (Al), tungsten (W), copper (Cu), and/or other suitable materials, and may be formed by CVD, PVC, plating and/or other suitable processes. Further, a CMP is performed to remove superfluous metals, such that a top surface of the ILD structure 220, a top surface of the gap-filling metal layer 232a, and a top surface of the gap-filling metal layer 232b are aligned (i.e., coplanar) with each other, as shown in FIG. 12. Accordingly, a metal gate 234a is obtained in the first region 204a, and a metal gate 234b is obtained in the second region 204b. As shown in FIG. 12, the metal gate 234a includes the high-k dielectric layer 222a, the metal layer 224a, the work function metal layer 226a, the metal layer 228a, the intervening metal layer 230a, and the gap-filling metal layer 232a, and the metal gate 234b includes the high-k dielectric layer 222b, the metal layer 224b, the work function metal layer 226b, the metal layer 228b, the intervening metal layer 230b and the gap-filling metal layer 232b. In some embodiments, further processes, such as contact and via formation, interconnect processing, etc., may be performed subsequently to complete the fabrication of the metal gates 234a and 234b.

Referring to FIG. 12, accordingly, the semiconductor structure 200 is formed including the first FET device 208a (i.e., the RF transistor) having the metal gate 234a, and the second FET device 208b (i.e., the logic transistor) having the metal gate 234b. In some embodiments, the high-k dielectric layer 222a of the metal gate 234a and the high-k dielectric layer 222b of the metal gate 234b include a same material and a same thickness. In some embodiments, the work function metal layer 226a of the metal gate 234a and the work function metal layer 226b of the metal gate 234b include a same material and a same thickness. In some embodiments, the gap-filling metal layer 232a of the metal gate 234a and the gap-filling metal layer 232b of the metal gate 234b include a same material. The metal gate 234a and the metal gate 234b have a same work function due to having the same material. Further, a width of the metal gate 234a is equal to a width of the metal gate 234b.

Still referring to FIG. 12, in some embodiments, the metal gate 234a of the first FET device 208a and the metal gate 234b of the second FET device 208b have different configurations. In the metal gate 234b, topmost portions of the high-k dielectric layer 222b, topmost portions of the metal layer 224b, topmost portions of the work function metal layer 226b, topmost portions of the metal layer 227b, topmost portions of the intervening metal layer 230b, and the top surface of the gap-filling metal layer 232b are aligned (i.e., coplanar) with each other. Further, the topmost portions and top surfaces of the above-mentioned layers, 222b, 224b, 226b, 228b, 230b and 232b, are aligned (i.e., coplanar) with the top surface of the ILD structure 220 over the substrate 202. Further, the gap-filling metal layer 232b has a consistent width. That is, a width of a bottom surface of the gap-filling metal layer 232b is equal to a width of the top surface of the gap-filling metal layer 232b. Accordingly, the gap-filling metal layer 232b may have an I-shaped configuration, but the disclosure is not limited thereto.

In contrast to the above configuration of the metal gate 234b, topmost portions of the high-k dielectric layer 222a, topmost portions of the intervening metal layer 230a and the top surface of the gap-filling metal layer 232a of the metal gate 234a of the first FET device 208a are aligned (i.e., coplanar) with the top surface of the ILD structure 220, while the topmost portions of the metal layer 224a, the topmost portions of the work function metal layer 226a and the topmost portions of the metal layer 228a are lower than the top surface of the ILD structure 220. Further, the intervening metal layer 230a is in contact with the topmost portions of the metal layer 224a, the topmost portions of the work function metal layer 226a, and the topmost portions of the metal layer 228a. As shown in FIG. 12, the gap-filling metal layer 232a has an inconsistent width. In some embodiments, the gap-filling metal layer 232a has a first portion 232*a*-1 and a second portion 232*a*-2 over the first portion 232*a*-1. A top surface of the second portion 232*a*-2 is aligned with the top surface of the ILD structure 220, and a bottom surface of the second portion 232*a*-2 is in contact with the intervening metal layer 230*a*. A width of the top surface of the gap-filling metal layer 232*a* is greater than a width of a bottom surface of the gap-filling metal layer 232*a*. In other words, a width of the second portion 232*a*-2 is greater than a width of the first portion 232*a*-1. Accordingly, the gap-filling metal layer 232*a* may have a T-shaped configuration, but the disclosure is not limited thereto. In some embodiments, the width of the second portion 232*a*-2 is greater than the width of the gap-filling metal layer 232*b*. In some embodiments, the width of the first portion 232*a*-1 is equal to the width of the gap-filling metal layer 232*b*, but the disclosure is not limited thereto. In other words, the width of the bottom surface of the gap-filling metal layer 232*a* is equal to the width of the bottom surface of the gap-filling metal layer 232*b*.

Additionally, the intervening metal layer 230*b* is entirely separated from the high-k dielectric layer 222*b*, while portions of the intervening metal layer 230*a* are in contact with the high-k dielectric layer 222*a*.

Figure 13:
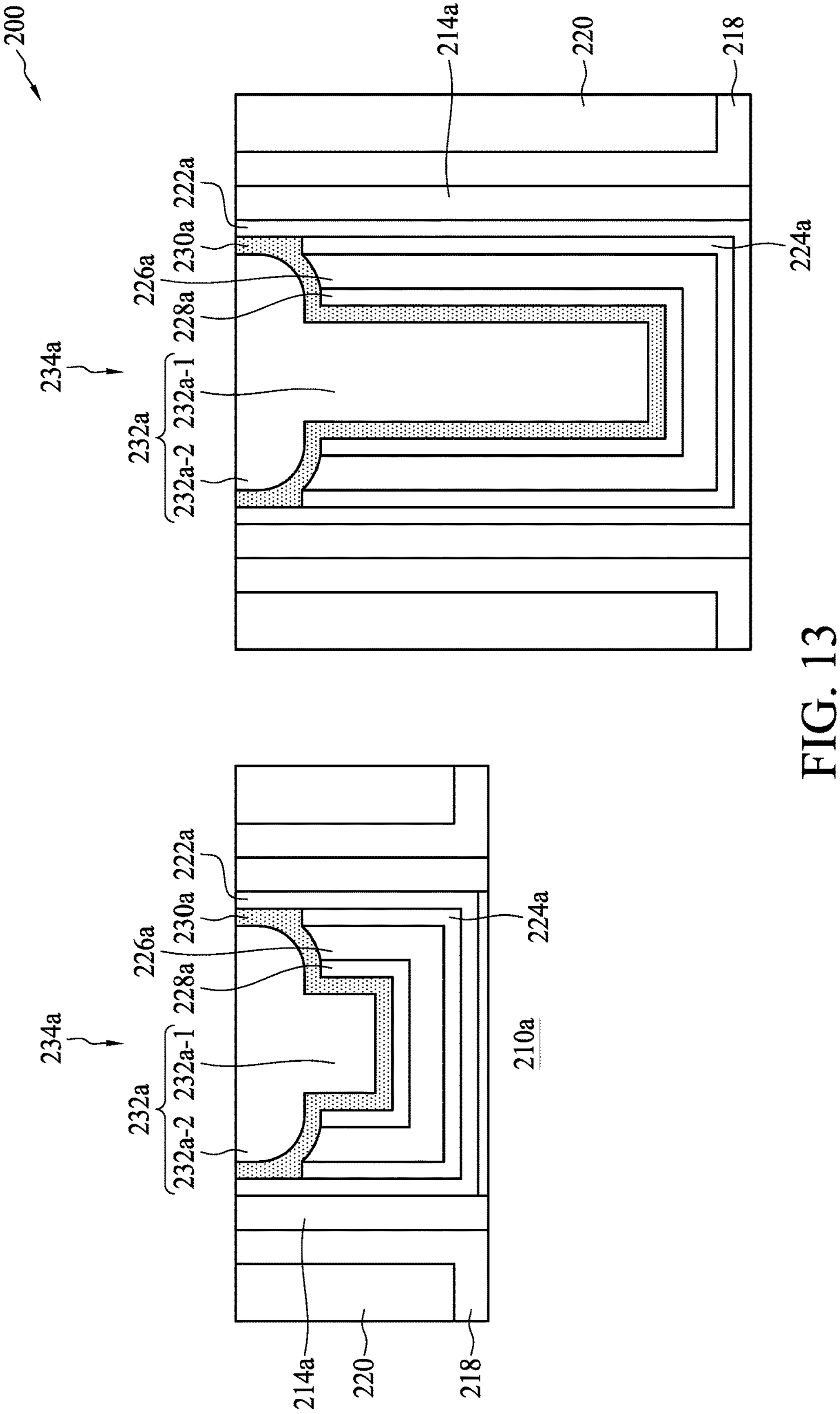
FIG. 13 shows a cross-sectional view taken along a line X3-X3' of FIG. 2.

Please refer to FIGS. 12 and 13, where FIG. 13 is a cross-sectional view taken along line X3-X3' of FIG. 2. The metal gate 234*a* is disposed not only over a portion of the fin structure 210*a*, but also over a portion of the isolation structure 206, as shown in FIG. 13. Comparing a volume of the gap-filling metal layer 232*a* and a volume of the gap-filling metal layer 232*b*, it can be seen that the volume of the gap-filling metal layer 232*a* is greater than the volume of the gap-filling metal layer 232*b* by between approximately 5% and approximately 30%. Accordingly, a resistance of the metal gate 234*a* is reduced and thus performance of the first FET device (i.e., the RF transistor) 208*a* is improved.

In some embodiments, a p-type FET device can be formed by the method 10, although not shown. The p-type FET device may have a metal gate having a configuration similar to that of the second device 208*b*. In such embodiments, the metal gate of the p-type FET device includes a high-k dielectric layer, a first work function metal layer over the high-k dielectric layer, a second work function metal layer over the first work function metal layer, an intervening metal layer and a gap-filling metal layer. The first work function metal layer provides work function for the p-type FET device, and may include a material same as those of the metal layers 224*a* and 224*b*. For example, the first work function metal layer includes TiN. The second work function metal layer includes material same as those of the work function metal layers 226*a* and 226*b*. For example, the second work function metal layer may include TiAl. The intervening metal layer include a material same as those of the intervening metal layers 230*a* and 230*b*, and the gap-filling metal layer includes a material same as those of the gap-filling metal layers 232*a* and 232*b*. In such embodiments, the gap-filling metal layer of the p-type FET device has an I-shaped configuration. Further, a width of a top surface of the gap-filling metal layer of the metal gate of the p-type FET device is less than the width of the top surface of the gap-filling metal layer 232*a* of the first device 208*a* (i.e., the RF transistor). Additionally, the width of the top surface of the gap-filling metal layer of the metal gate of the p-type FET device is equal to the width of the top surface of the gap-filling metal layer 232*b* of the second device 208*b* (i.e., the logic transistor).

According to the method 10 provided by the present disclosure, resistance of the metal gate 234*a* is reduced and performance of the RF device 208*a* is improved due to the T-shaped gap-filling metal layer 232*a*, while the operations for forming the RF transistor 208*a* and the logic transistor 208*b* maintain process stability. In other words, influence on the logic transistor 208*b* caused by the forming of the T-shaped gap-filling metal layer 232*b* of the RF transistor 208*a* is negligible. It is therefore concluded that the method 10 provided by the present disclosure is compatible with the operations for forming a semiconductor structure having the RF devices and the logic devices integrated together.

In some embodiments, the method 10 can be performed to form other devices. For example, while forming the first device 208*a* and the second device 208*b* having a same conductivity type (i.e., the n type), the method 10 can be performed to form p-type device at the same time. FIGS. 14 to 20 shows cross-sectional views of a semiconductor structure including an n-type FET device and a p-type FET device at various stages of the method 10 according to aspects of the present disclosure. It should be understood that same elements in FIGS. 2 to 12 and FIGS. 14 to 20 are depicted by same numerals, and can include same materials, and thus repeated descriptions may be omitted in the interest of brevity.

Figure 14:
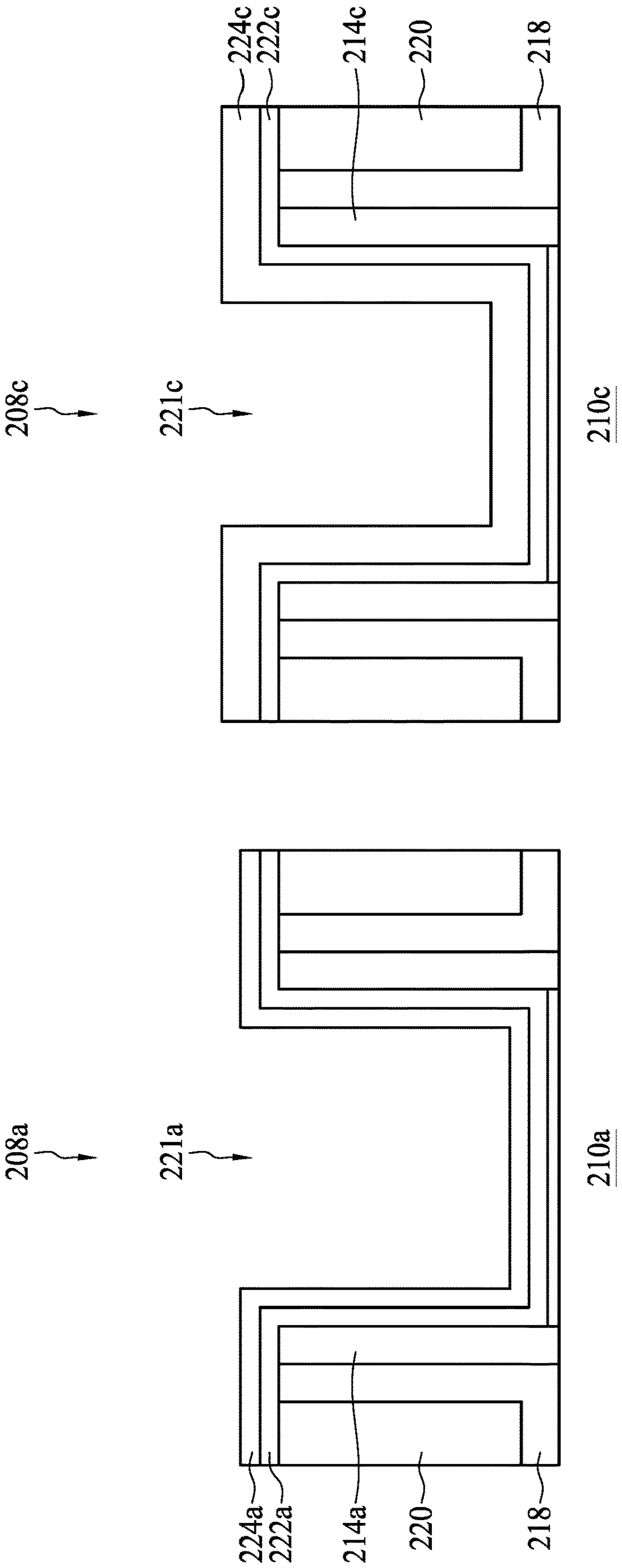
FIGS. 14 to 20 show cross-sectional views respectively at various stages in the method for forming a semiconductor structure according to aspects of the present disclosure.

Referring to FIG. 14, in operation 101, a substrate is received, and the substrate may have different regions with STI structures interposing the regions for providing electrical isolation. The regions are defined for accommodating different devices. In operation 102, a first FET device 208*a* and a third FET device 208*c* are formed in the different regions. In some embodiments, both of the first and the third FET devices 208*a* and 208*c* are RF transistors, but the disclosure is not limited thereto. In some embodiments, the first and the third FET devices 208*a* and 208*c* may both be logic devices or memory devices. However, the first FET device 208*a* and the third FET device 208*c* are complementary to each other. For example, the first FET device 208*a* may be an n-type FET device, and the third FET device 208*c* may be a p-type FET device.

As mentioned above, the first FET device 208*a* includes a fin structure 210*a*, a sacrificial gate (not shown), a spacer 214*a* and a source/drain (not shown). Similarly, the third FET device 208*c* includes a fin structure 210*c*, a sacrificial gate (not shown), a spacer 214*c* and a source/drain (not shown). A portion of the fin structure 210*a* covered by the sacrificial gate serves as a channel region. In some embodiments, a width of the fin structure 210*a* and a width of the fin structure 210*c* are equal, but the disclosure is not limited thereto. In some embodiments, a CESL 218 is formed over the substrate. Subsequently, an ILD structure 220 is formed on the CESL 218. Next, a polishing process such as a CMP is performed on the ILD structure 220 and the CESL 218 to expose top surfaces of the sacrificial gates.

In operation 103, a gate trench 221*a* is formed in the first FET device 208*a*, and a gate trench 221*c* is formed in the third FET device 208*c*. In some embodiments, a width of the gate trench 221*a* is equal to a width of the gate trench 221*c*, but the disclosure is not limited thereto. As mentioned above, the sacrificial gates are removed. Accordingly, the fin structure 210*a* is exposed through the gate trench 221*a*, and the fin structure 210*c* is exposed through the gate trench 221*c*.

Still referring to FIG. 14, in some embodiments, in operation 104, the method 10 includes forming a high-k dielectric layer 222*a* in the gate trench 221*a*, and a high-k dielectric layer 222*c* in the gate trench 221*c*. A thickness of the high-k dielectric layer 222*a* and a thickness of the high-k dielectric layer 222*c* are similar. In some embodiments, an IL layer may be formed prior to the forming of the high-k dielectric layers 222*a* and 222*c*, though not shown.

Still referring to FIG. 14, in some embodiments, in operation 105, the method 10 includes forming a work function metal layer in the gate trench 221*a* and a work function metal layer in the gate trench 221*c*. In some embodiments, the operation 105 further includes forming other layers prior to and after the forming of the work function metal layers. For example, a metal layer 224*a* may be formed in the gate trench 221*a*, and the metal layer 224*a* is in contact with the high-k dielectric layer 222*a*. In some embodiments, a work function metal layer 224*c* is formed in the gate trench 221*c*, and the work function metal layer 224*c* is in contact with the high-k dielectric layer 222*c*. The work function metal layer 224*c* provides a work function for a p-type FET device 208*c*. In some embodiments, the metal layer 224*a* and the work function metal layer 224*c* include a same material such as, for example but not limited thereto, TiN. Further, a thickness of the metal layer 224*a* is less than a thickness of the work function metal layer 224*c*. The metal layer 224*a* serves as a buffer layer or a barrier layer. Materials and the thickness of the metal layer 224*a* may be selected depending on functions to be provided by that the metal layer 224*a*, and repeated descriptions are omitted for brevity.

Figure 15:
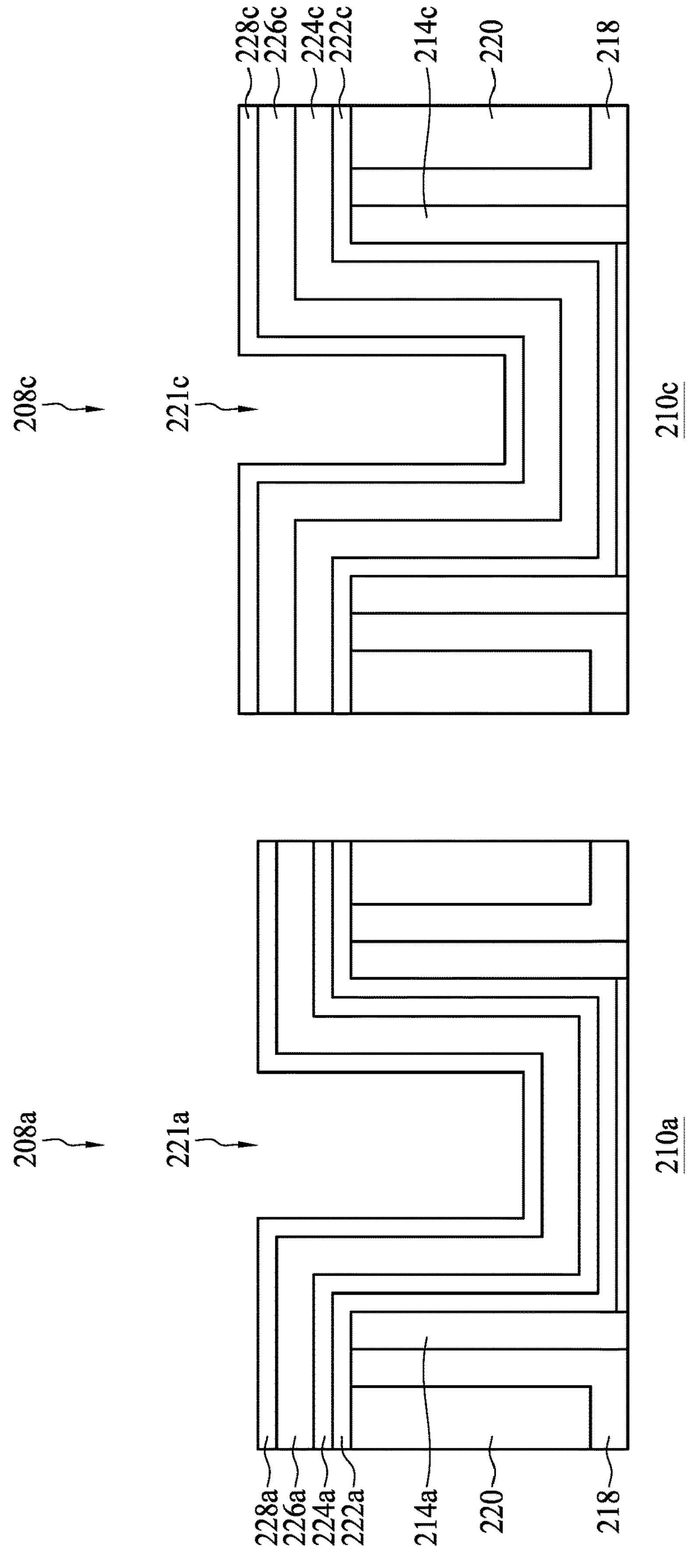

Referring to FIG. 15, in some embodiments, a work function metal layer 226*a* is formed over the metal layer 224*a* in the gate trench 221*a*. The work function metal layer 226*a* provides a work function for the n-type FET device 208*a*. Further, a metal layer 226*c* is formed over the work function metal layer 224*c* in the gate trench 221*c*. In some embodiments, the work function metal layer 226*a* and the metal layer 226*c* include a same material. For example, the work function metal layer 226*a* and the metal layer 226*c* both include TiAl. In some embodiments, a thickness of the work function metal layer 226*a* and a thickness of the metal layer 226*c* are equal, but the disclosure is not limited thereto.

Still referring to FIG. 15, in some embodiments, another metal layer 228*a* is formed over the work function metal layer 226*a* in the gate trench 221*a*, and another metal layer 228*c* is formed over the metal layer 226*c* in the gate trench 221*c*. In some embodiments, the metal layers 228*a* and 228*c* include TiN, but the disclosure is not limited thereto. Thicknesses of the metal layers 228*a* and 228*c* are less than the thicknesses of the work function metal layer 226*a* and the metal layer 226*c*. Further, the thickness of the metal layer 228*a* and the thickness of the metal layer 228*c* are equal.

Figure 16:
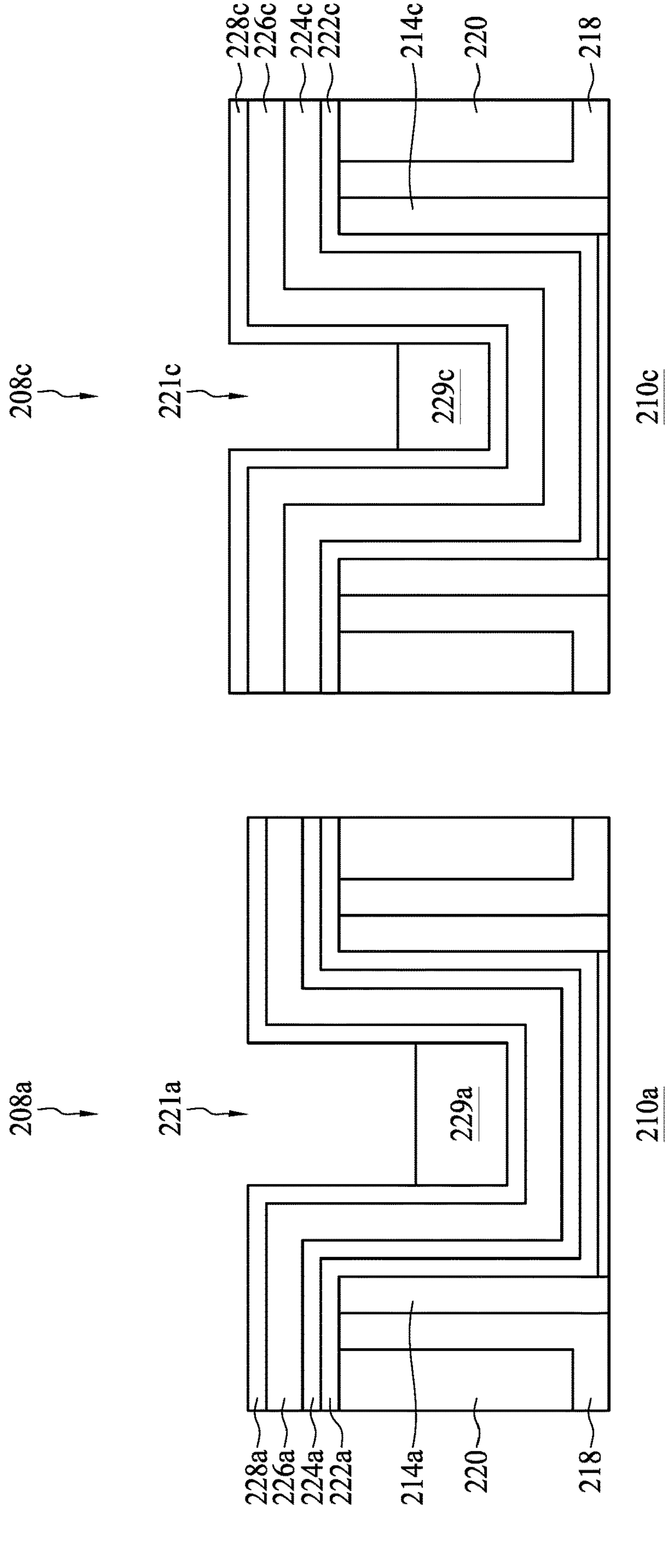

In operation 106, a portion of the work function metal layer 226*a* is removed from the gate trench 221*a*. In some embodiments, operation 106 may include further processes. For example, a portion of the work function metal layer 224*c* is removed from the gate trench 221*c*. In such embodiments, as shown in FIG. 16, a sacrificial layer 229*a* is formed in the gate trench 221*a* and a sacrificial layer 229*c* is formed in the gate trench 221*c*. In some embodiments, the sacrificial layers 229*a* and 229*c* include a same material, such as a photoresist, but the disclosure is not limited thereto. In some embodiments, a sacrificial material is formed over the substrate 202 and fills the gate trenches 221*a* and 221*c*. Subsequently, portions of the sacrificial material are removed to form the sacrificial layers 229*a* and 229*c*. As shown in FIG. 16, a top surface of the sacrificial layer 229*a* is lower than an opening of the gate trench 221*a*, and a top surface of the sacrificial layer 229*c* is lower than an opening of the gate trench 221*c*.

Figure 17:
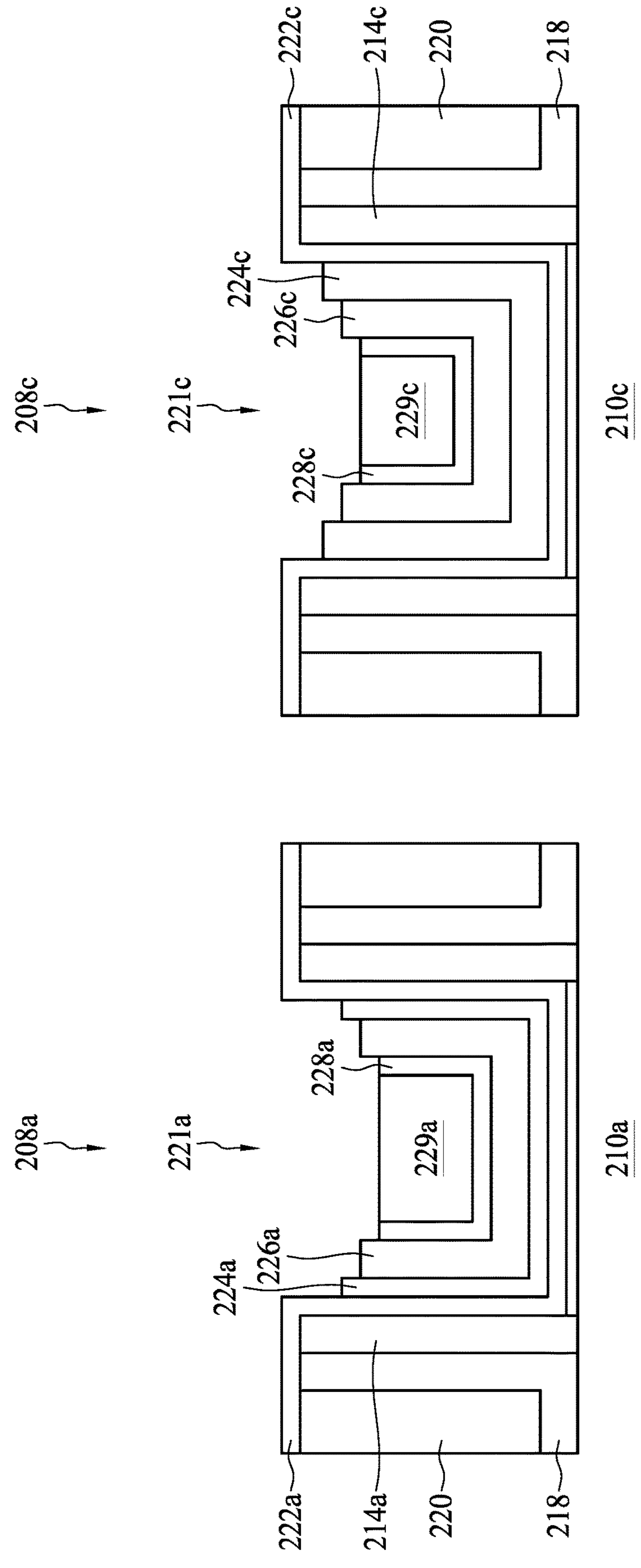
Figure 18:
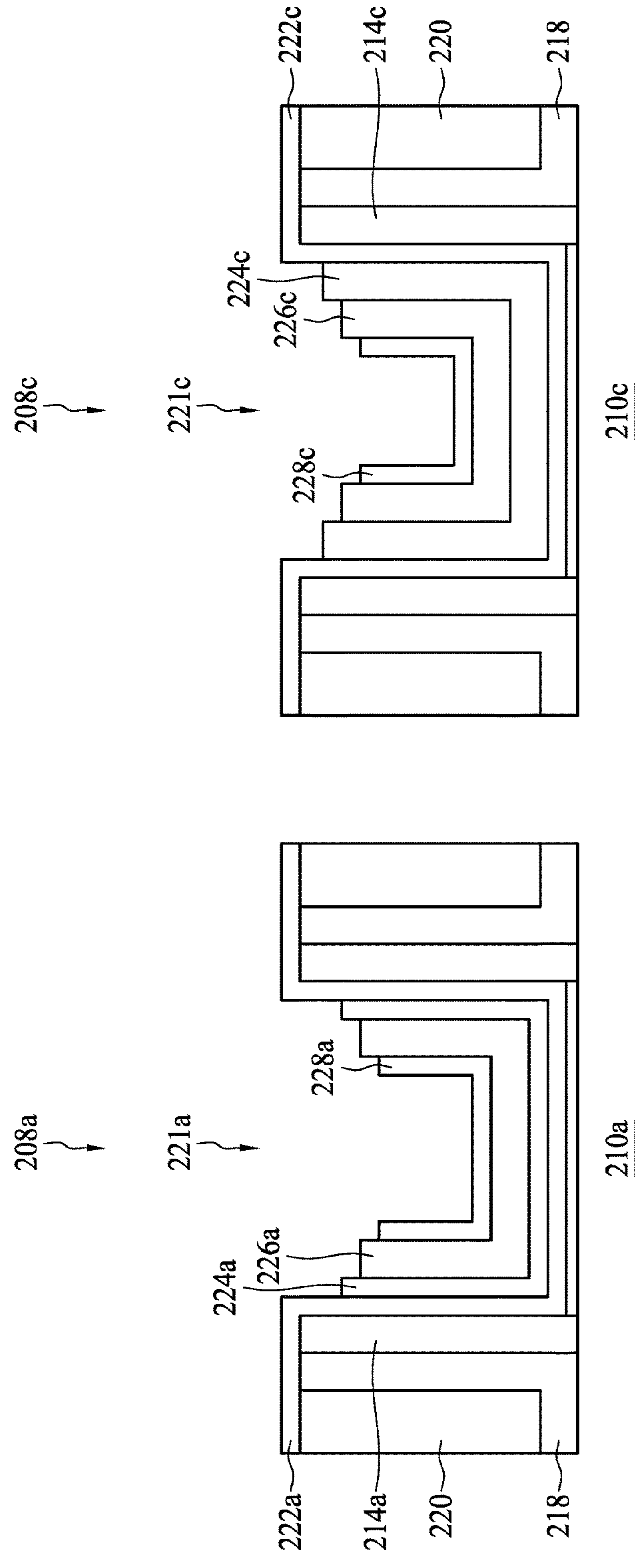

Referring to FIG. 17, in operation 106, portions of the metal layer 228*a*, portions of the work function metal layer 226*a* and portions of the metal layer 224*a* are removed from the gate trench 221*a*. Similarly, portions of the metal layer 228*c*, portions of the metal layer 226*c*, and portions of the work function metal layer 224*c* are removed from the gate trench 221*c*. Accordingly, topmost portions of the metal layer 228*a*, topmost portions of the work function metal layer 226*a*, and topmost portions of the metal layer 224*a* are lower than the opening of the gate trench 221*a*, and topmost portions of the metal layer 228*c*, topmost portions of the metal layer 226*c* and topmost portions of the work function metal layer 224*c* are lower than the opening of the gate trench 221*c*. In some embodiments, the high-k dielectric layers 222*a* and 222*c* serve as an etch stop layer, and thus the ILD structure 220 and the CESL 218 are protected by the high-k dielectric layers 222*a* and 222*c*. Referring to FIG. 18, the sacrificial layers 229*a* and 229*c* are then removed.

Figure 19:
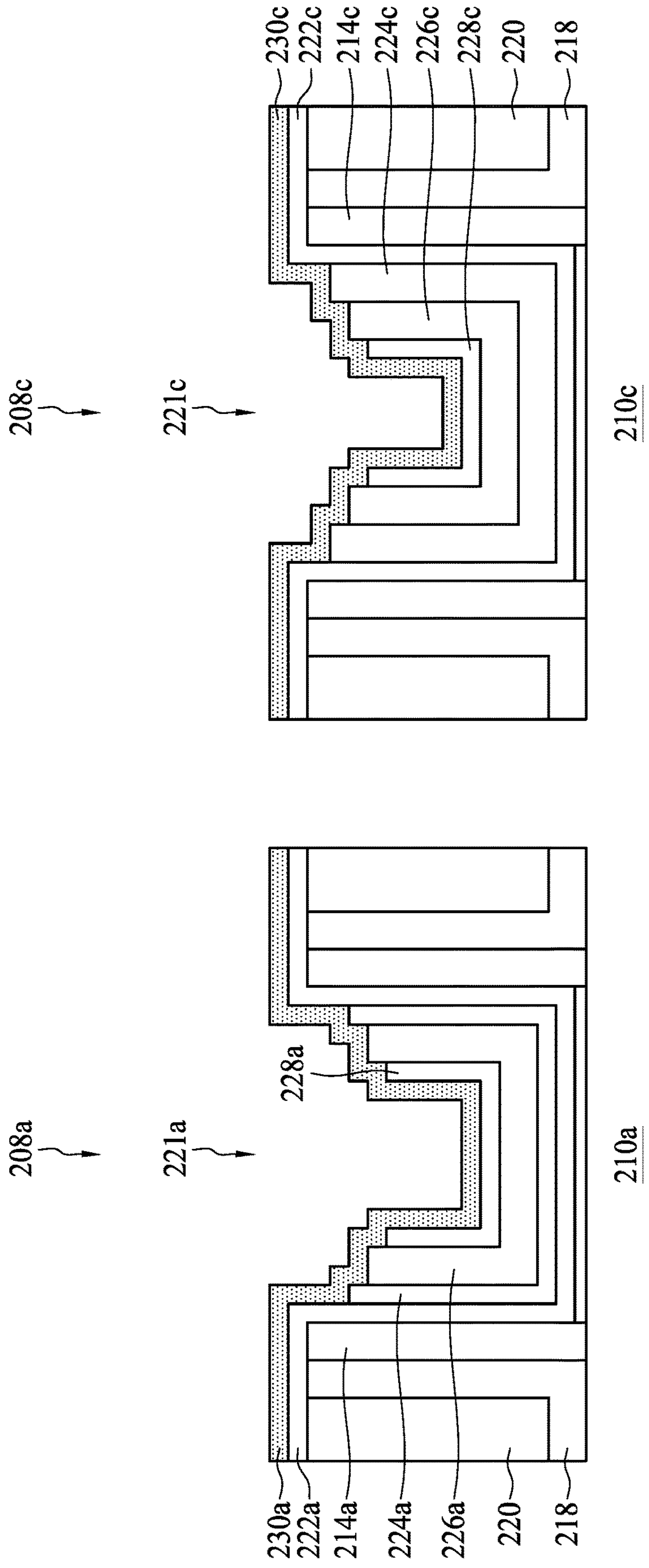

In operation 107, the gate trenches 221*a* and 221*c* are filled with a gap-filling metal layer. In some embodiments, the operation 107 includes further processes. For example, an intervening metal layer 230*a* is formed in the gate trench 221*a*, and an intervening metal layer 230*c* is formed in the gate trench 221*c*, as shown in FIG. 19. In some embodiments, the intervening metal layers 230*a* and 230*c* include a same material, such as TiN, but the disclosure is not limited thereto. In some embodiments, the intervening metal layers 230*a* and 230*c* include a same thickness, but the disclosure is not limited thereto. As mentioned above, the intervening metal layers 230*a* and 230*c* serve as glue layers for improving attachment between the metal layers 228*a* and 228*c* and layers to be subsequently formed.

Figure 20:
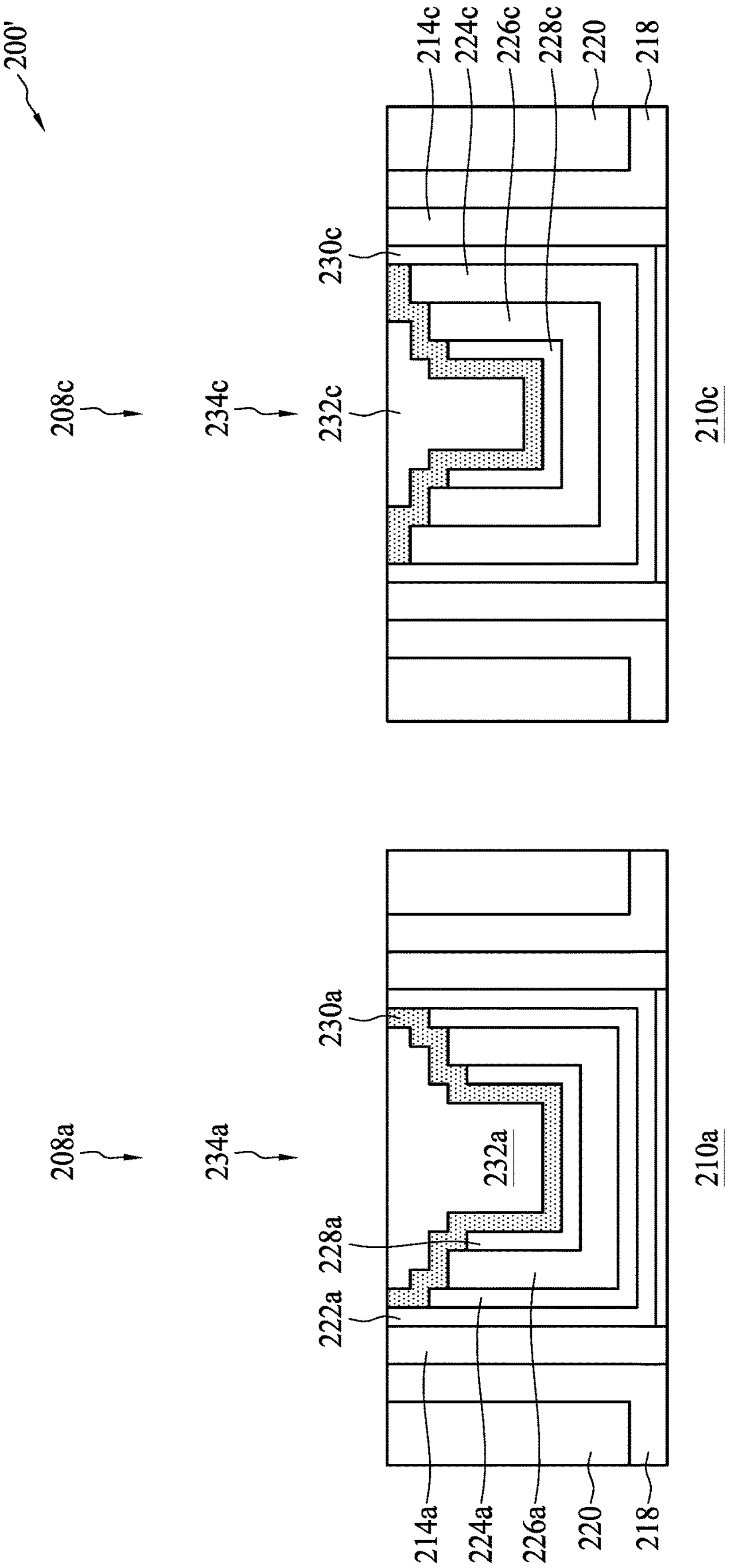

Referring to FIG. 20, a gap-filling metal layer 232*a* is formed to fill the gate trench 221*a*, and a gap-filling metal layer 232*c* is formed to fill the gate trench 221*c*. The gap-filling metal layers 232*a* and 232*c* may include tungsten. Further, a CMP is performed to remove superfluous materials, such that a top surface of the ILD structure 220, a top surface of the gap-filling metal layer 232*a*, and a top surface of the gap-filling metal layer 232*c* are aligned (i.e., coplanar) with each other, as shown in FIG. 20. Accordingly, a metal gate 234*a* is obtained for the n-type FET device 208*a*, and a metal gate 234*c* is obtained for the p-type FET device 208*c*. As shown in FIG. 20, the metal gate 234*a* includes the high-k dielectric layer 222*a*, the metal layer 224*a*, the work function metal layer 226*a*, the metal layer 228*a*, the intervening metal layer 230*a*, and the gap-filling metal layer 232*a*, and the metal gate 234*c* includes the high-k dielectric layer 222*c*, the work function metal layer 224*c*, the metal layer 226*c*, the metal layer 228*c*, the intervening metal layer 230*c* and the gap-filling metal layer 232*c*. In some embodiments, further processes, such as contact and via formation, interconnect processing, etc., may be performed subsequently to complete the fabrication of the metal gates 234*a* and 234*c*.

Referring to FIG. 20, accordingly, a semiconductor structure 200' including the n-type FET device 208*a* and the p-type FET device 208*c* is obtained. In such embodiments, the work function metal layer 226*a* of the n-type FET device 208*a* is different from the work function metal layer 224*c* of the p-type FET device 208*c*. As mentioned above, the topmost portions of the high-k dielectric layer 222*a*, the topmost portions of the intervening metal layer 230*a*, and a top surface of the gap-filling metal layer 232*a* of the metal gate 234*a* of the n-type FET device 208*a* are aligned (i.e., coplanar) with the top surface of the ILD structure 220, while the topmost portions of the metal layer 224*a*, the topmost portions of the work function metal layer 226*a* and the topmost portions of the metal layer 228*a* are lower than the top surface of the ILD structure 220. In addition, the topmost portions of the high-k dielectric layer 222*c*, the topmost portions of the intervening metal layer 230*c*, and the top surface of the gap-filling metal layer 232*c* of the metal gate 234*c* of the p-type FET device 208*c* are aligned (i.e., coplanar) with the top surface of the ILD structure 220, while the topmost portions of the work function metal layer 224*c*, the topmost portions of the metal layer 226*c* and the topmost portions of the metal layer 228*c* are lower than the top surface of the ILD structure 220.

Further, the intervening metal layer 230*a* is in contact with the topmost portions of the metal layer 224*a*, the topmost portions of the work function metal layer 226*a*, and the topmost portions of the metal layer 228*a*. The intervening metal layer 230*c* is in contact with the topmost portions of the work function metal layer 224*c*, the topmost portions of the metal layer 226*c*, and the topmost portions of the metal layer 228*c*. Therefore, both of the gap-filling metal layers 232*a* and 232*c* have inconsistent widths. In some embodiments, a width of an upper portion of the gap-filling metal layer 232*a* is greater than a width of a lower portion of the gap-filling metal layer 232*a*. A width of an upper portion of the gap-filling metal layer 232*c* is greater than a width of the lower portion of the gap-filling metal layer 232*c*. Accordingly, both of the gap-filling metal layers 232*a* and 232*c* have a T-shaped configuration, but the disclosure is not limited thereto. In some embodiments, the width of the upper portion of the gap-filling metal layer 232*a* is greater than the width of the upper portion of the gap-filling metal layer 232*c*. In some embodiments, the width of the lower portion of the gap-filling metal layer 232*a* is greater than the width of the lower portion of the gap-filling metal layer 232*c*, but the disclosure is not limited thereto.

Additionally, a portion of the intervening metal layer 230*a* is in contact with the high-k dielectric layer 222*a*, and a portion of the intervening metal layer 230*c* is in contact with the high-k dielectric layer 222*c*.

According to the method provided by the present disclosure, resistances of the metal gates 234*a* and 234*c* are reduced and performances of the n-type FET device 208*a* and the p-type FET device 208*c* are improved due to the T-shaped gap-filling metal layers 232*a* and 232*c*. In some embodiments, the method 10 can be performed to form an RF transistor and/or a logic transistor. It is therefore concluded that the method 10 provided by the present disclosure is compatible with the operations for forming a semiconductor structure.

In summary, a semiconductor structure including an RF device and a logic device is provided according to the present disclosure. The RF device and the logic device respectively include a metal gate. In some embodiments, a width of the metal gate of the RF device is equal to a width of the metal gate of the logic device. However, a width of a gap-filling metal in the metal gate of the RF device is greater than a width of a gap-filling metal in the metal gate of the logic device. In such embodiments, a volume of the gap-filling metal of the RF device is increased, and thus parasitic resistance of the RF device is reduced.

According to one embodiment of the present disclosure, a semiconductor structure is provided. The semiconductor structure includes a first transistor and a second transistor. The first transistor includes a first fin structure and a first metal gate over the first fin structure. The first metal gate includes a first work function metal layer and a first gap-filling metal layer. The second transistor includes a second fin structure and a second metal gate over the second fin structure. The second metal gate includes a second work function metal layer and a second gap-filling metal layer. The first metal gate and the second metal gate provide a same work function. A width of the first metal gate is equal to a width of the second metal gate. A width of a top surface of the first gap-filling metal layer is greater than a width of a top surface of the second gap-filling metal layer.

According to one embodiment of the present disclosure, a semiconductor structure is provided. The semiconductor structure includes an RF device and a logic device. The RF device include a first metal gate, and the first metal gate includes a first gap-filling metal layer. A width of a top surface of the first gap-filling metal layer is greater than a width of a bottom surface of the first gap-filling metal layer. The logic device includes a second metal gate, and the second metal gate includes a second gap-filling metal layer. The first metal gate and the second metal gate provide a same work function. A width of the first metal gate is equal to a width of the second metal gate. A width of a top surface of the second gap-filling metal layer is equal to a width of a bottom surface of the second gap-filling metal layer.

According to one embodiment of the present disclosure, a method for forming a semiconductor is provided. The method includes following operations. A substrate including a first region and a second region is received. A first FET device is formed in the first region, and a second FET device is formed in the second region. A first gate trench is formed in the first FET device, and a second gate trench is formed in the second FET device. A first high-k dielectric layer is formed in the first gate trench, and a second high-k dielectric layer is formed in the second gate trench. A first work function metal layer is formed in the first gate trench, and a second work function metal layer is formed in the second gate trench. The first gate trench is filled with a first gap-filling metal layer, and the second gate trench is filled with a second gap-filling metal layer. A width of a top surface of the first gap-filling metal layer is greater than a width of a top surface of the second gap-filling metal layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:

receiving a substrate comprising a first region and a second region;

forming a first FET device in the first region and a second FET device in the second region;

forming a first gate trench in the first FET device and a second gate trench in the second FET device;

forming a first high-k dielectric layer in the first gate trench and a second high-k dielectric layer in the second gate trench;

forming a first work function metal layer in the first gate trench and a second work function metal layer in the second gate trench;

removing a portion of the first work function metal layer from the first gate trench;

forming a first intervening metal layer in the first gate trench and a second intervening metal layer in the second gate trench, wherein the second intervening metal layer is separated from the second work function metal layer; and filling the first gate trench with a first gap-filling metal layer and filling the second gate trench with a second gap-filling metal layer, wherein a width of a top surface of the first gap-filing metal layer is greater than a width of a top surface of the second gap-filling metal layer.

2. The method of claim 1, wherein the first work function metal layer and the second work function metal layer comprise a same material.

3. The method of claim 1, wherein the removing of the portion of the first work function metal layer further comprises:

forming a first sacrificial layer in the first gate trench in the first region, wherein a top surface of the first sacrificial layer is lower than an opening of the first gate trench;

forming a second sacrificial layer in the second region; and removing the portion of the first work function metal layer exposed through the first sacrificial layer.

4. The method of claim 1, wherein a portion of the first intervening metal layer is in contact with the first high-k dielectric layer, and a portion of the first intervening metal layer is in contact with a topmost portion of the first work function metal layer.

5. The method of claim 1, wherein the second intervening metal layer is entirely separated from the second high-k dielectric layer.

6. A method for forming a semiconductor structure, comprising:

forming a first FET device and a second FET device over a substrate;

forming a first gate trench in the first FET device and a second gate trench in the second FET device;

forming a first high-k dielectric layer in the first gate trench and a second high-k dielectric layer in the second gate trench;

forming a first work function metal layer in the first gate trench and a second work function metal layer in the second gate trench;

removing a portion of the first work function metal layer from the first gate trench;

forming a first intervening metal layer in the first gate trench and a second intervening metal layer in the second gate trench; and filling the first gate trench with a first gap-filling metal layer and filling the second gate trench with a second gap-filling metal layer, wherein the first intervening metal layer is in contact with the first high-k dielectric layer, and the second intervening metal layer is separated from the second work function metal layer and the second high-k dielectric layer.

7. The method of claim 6, wherein the first work function metal layer and the second work function metal layer comprise a same material.

8. The method of claim 6, wherein the first intervening metal layer and the second intervening metal layer comprise a same material.

9. The method of claim 6, wherein the removing of the portion of the first work function metal layer further comprises:

forming a first sacrificial layer in the first gate trench in the first region and a second sacrificial layer in the second gate trench, wherein a top surface of the first sacrificial layer is lower than a top surface of the second sacrificial layer; and removing the portion of the first work function metal layer exposed through the first sacrificial layer.

10. The method of claim 6, wherein the first intervening metal layer is in contact with a topmost portion of the first work function metal layer.

11. The method of claim 6, wherein a topmost portion of the first work function metal layer is lower than a topmost portion of the first high-k dielectric layer, a topmost portion of the first intervening metal layer, and a top surface of the first gap-filling metal layer.

12. The method of claim 11, wherein a topmost portion of the second work function metal layer, a topmost portion of the second high-k dielectric layer, a topmost portion of the second intervening metal layer, and a top surface of the second gap-filling metal layer are aligned with each other.

13. The method of claim 12, wherein the topmost portion of the first work function metal layer is lower than the topmost of the second work function metal layer, the topmost portion of the second high-k dielectric layer, the topmost portion of the second intervening metal layer, and the top surface of the second gap-filling metal layer.

14. The method of claim 6, wherein the first gap-filling metal layer comprises a T-shaped configuration.

15. The method of claim 6, wherein the second gap-filling metal layer comprises an I-shaped configuration.

16. A method for forming a semiconductor structure, comprising:

forming a first FET device and a second FET device over a substrate;

forming a first gate trench in the first FET device and a second gate trench in the second FET device;

forming a first high-k dielectric layer in the first gate trench and a second high-k dielectric layer in the second gate trench;

forming a first metal layer in the first gate trench and a second metal layer in the second gate trench, wherein a thickness of the first metal layer is less than a thickness of the second metal layer;

forming a third metal layer over the first metal layer and a fourth metal layer over the second metal layer, wherein a thickness of the third metal layer is equal to a thickness of the fourth metal layer;

removing a portion of the first metal layer and a portion of the third metal layer from the first gate trench and removing a portion of the second metal layer and a portion of the fourth metal layer from the second gate trench;

forming a first intervening metal layer in the first gate trench and a second intervening metal layer in the second gate trench, wherein the second intervening metal layer is in contact with a topmost portion of the second metal layer and a topmost portion of the fourth metal layer; and filling the first gate trench with a first gap-filling metal layer and filling the second gate trench with a second gap-filling metal layer, wherein a width of a top surface of the first gap-filing metal layer is greater than a width of a top surface of the second gap-filling metal layer.

17. The method of claim 16, wherein the first metal layer and the second metal layer comprise a same material.

18. The method of claim 16, wherein the third metal layer and the fourth metal layer comprise a same material.

19. The method of claim 16, wherein a distance between a bottom surface of the first gap-filling metal layer and a top surface of the first high-k dielectric layer is less than a distance between a bottom surface of the second gap-filling metal layer and a top surface of the second high-k dielectric layer.

20. The method of claim 16, wherein the removing of the portion of the first metal layer and the portion of the third metal layer from the first gate trench and the removing the portion of the second metal layer and the portion of the fourth metal layer from the second gate trench further comprises:

forming a first sacrificial layer in the first gate trench and a second sacrificial layer in the second gate trench, wherein a top surface of the first sacrificial layer is lower than an opening of the first gate trench, and a top surface of the second sacrificial layer is lower than an opening of the second gate trench; and removing the portion of the first metal layer and the portion of the third metal layer exposed through the first sacrificial layer, and removing the portion of the second metal layer and the portion of the fourth metal layer exposed through the second sacrificial layer.

* * * * *